United States Patent
Yamada et al.

(10) Patent No.: US 7,754,415 B2
(45) Date of Patent: Jul. 13, 2010

(54) PROCESS FOR PRODUCING LASER ENGRAVABLE PRINTING SUBSTRATE

(75) Inventors: Hiroshi Yamada, Mishima (JP); Kei Tomeba, Fuji (JP); Miyoshi Watanabe, Fuji (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 607 days.

(21) Appl. No.: 10/587,403

(22) PCT Filed: Jan. 26, 2005

(86) PCT No.: PCT/JP2005/000954

§ 371 (c)(1),
(2), (4) Date: Jul. 26, 2006

(87) PCT Pub. No.: WO2005/070692

PCT Pub. Date: Aug. 4, 2005

(65) Prior Publication Data

US 2007/0178408 A1    Aug. 2, 2007

(30) Foreign Application Priority Data

Jan. 27, 2004    (JP) .............................. 2004-018472

(51) Int. Cl.
G03F 7/09    (2006.01)
G03F 7/40    (2006.01)

(52) U.S. Cl. ........................ 430/300; 430/309; 430/306; 101/401.1

(58) Field of Classification Search .............. 430/270.1, 430/281.1, 300, 30, 945, 271.1, 275.1, 278.1, 430/322, 328; 522/38, 64, 76
See application file for complete search history.

(56) References Cited

U.S. PATENT DOCUMENTS 4,641,958 A * 2/1987 Wally et al. ................... 355/71
5,362,604 A * 11/1994 Yatsuyanagi ............. 430/281.1
5,798,202 A     8/1998 Cushner et al.
5,804,353 A     9/1998 Cushner et al.
6,352,804 B1    3/2002 Sakamoto et al.
7,029,825 B2 *  4/2006 Yokota et al. ............. 430/281.1
2002/0123003 A1* 9/2002 Kannurpatti et al. ...... 430/270.1
2005/0185232 A1 8/2005 Teranishi et al.

FOREIGN PATENT DOCUMENTS

| EP | 1 382 446 A1 | | 1/2004 |
| JP | 56-64823 | | 6/1981 |
| JP | 05-58076 | | 3/1993 |
| JP | 08-216489 | | 8/1996 |
| JP | 2846954 | | 10/1998 |
| JP | 2846955 | | 10/1998 |
| JP | 2002-79645 | | 3/2002 |
| JP | 2003-241397 | | 8/2003 |
| JP | 2003241397 A | * | 8/2003 |
| WO | WO 03/022594 | | 3/2003 |
| WO | WO 2005/005147 | | 1/2005 |

* cited by examiner

*Primary Examiner*—Cynthia H Kelly
*Assistant Examiner*—Anca Eoff
(74) *Attorney, Agent, or Firm*—Finnegan, Henderson, Farabow, Garrett & Dunner, L.L.P.

(57) ABSTRACT

A process for producing a laser engravable printing substrate, comprising the step of forming a layer of photosensitive resin composition on a cylindrical support or sheeted support and the step of irradiating the formed layer of photosensitive resin composition with light to thereby provide a layer of cured photosensitive resin of 50 μm to 50 mm thickness, wherein the light for irradiation of the photosensitive resin composition layer contains a ray of 200 to 450 nm wavelength and wherein the light illuminance on the surface of the photosensitive resin composition layer is in the range of 20 mW/cm$^2$ to 2 W/cm$^2$ when measured with the use of UV meter (trade name "UV-M02" manufactured by Ohku Seisakusho) and filter (trade name "UV-35-APR Filter" manufactured by Ohku Seisakusho) and in the range of 3 mW/cm$^2$ to 2 W/cm$^2$ when measured with the use of the above UV meter and filter (trade name "UV-25 Filter" manufactured by Ohku Seisakusho).

13 Claims, 4 Drawing Sheets

PROCESS FOR PRODUCING LASER ENGRAVABLE PRINTING SUBSTRATE

TECHNICAL FIELD

The present invention relates to a process for producing a laser engravable printing substrate capable of, which is suitable for production of a cylindrical or sheeted flexographic original plate, letterpress printing original plate, gravure printing original plate, screen printing original plate or offset printing blanket capable of laser engraving, which is suitable for formation of a relief image for a printing plate, formation of a pattern for surface processing such as embossing, formation of a relief image for printing of a tile or the like, pattern printing of a conductor, a semiconductor or an insulator in formation of an electronic circuit, formation of a pattern of a functional material such as an antireflection film, a color filter or a (near) infrared cut filter of a optical component, and further, formation of a coating and a pattern of an oriented film, a ground layer, a luminescent layer, an electron transport layer or a sealing material layer in production of a display element of a liquid crystal display, an organic electroluminescence display or the like.

BACKGROUND ART

Various kinds of printing processes such as flexographic printing, letter press printing, gravure printing, screen printing and offset printing are used for packaging materials such as corrugated boards, paper containers, paper bags and flexible packaging films, building and decoration materials such as wallpapers and decorative plates, label printing and the like. Particularly, flexographic printing, or letter press printing using a resin letterpress having a relatively high hardness has an increased proportion among a various kinds of printing processes. For fabrication of printing plates for use in these printing processes, normally, photosensitive resins are often used. For example, a process in which a liquid photosensitive resin or a solid photosensitive resin plate in the form of a sheet is used, a photo mask is placed on the photosensitive resin, light is applied through the mask to cause a crosslinking reaction, and non-crosslinked parts are then washed out with a developing solution has been used. In recent years, so called a flexographic CTP technique of providing a thin light absorption layer called a black layer on the surface of a photosensitive resin, applying laser light to the layer to form a mask image directly on a photosensitive resin plate, then applying light through the mask to cause a crosslinking reaction, and then washing out non-crosslinked parts of areas to which no light is applied has been developed and increasingly employed in terms of the effect of improving efficiency of fabrication of a printing plate. However, this technique has a limited effect of improving the efficiency, and has a problem of absolutely requiring a developing step, and a technique in which a relief image is formed directly on a printing original plate using laser and no developing step is required is desired.

One process for solving the problem is a process in which a printing original plate is directly subjected to laser engraving. Fabrication of letterpress printing plates and stamps by this process has already been conducted. As materials for use in this process, materials prepared by heating and curing synthetic rubbers such as EPDM and silicones have already been used. However, not only these materials require much time for production because it takes much time for heating and curing to achieve necessary mechanical properties, aging is further required until the properties become stable, and so on, but also the former materials using synthetic resins and the like as raw materials have a disadvantage that sculpture debris is stuck on the surface of a plate when the plate is subjected to laser engraving, and it is so difficult to remove the debris that a precise image cannot be formed, and the latter materials using silicones as raw materials have a disadvantage that the speed of laser engraving is so low that it takes much time to fabricate a plate, the resistance to a solvent ink is low, and so on.

As a process for overcoming the disadvantages of the materials described above, a process for producing a laser engraving flexographic printing plate, in which laser light is applied to a cured photosensitive resin obtained by photo-curing a photosensitive resin composition to form a concavo-convex pattern on the surface, has been proposed.

For example, Patent Document 1 (Japanese Patent No. 2846954 (U.S. Pat. No. 5,798,202)) and Patent Document 2 (Japanese Patent No. 2846955 (U.S. Pat. No. 5,804,353)) disclose use of a material prepared by mechanically, photochemically and thermochemically reinforcing a thermoplastic elastomer such as SBS, SIS or SEBS.

Patent Document 3 (JP-A-56-64823) and Patent Document 4 (JP-A-2002-79645) disclose a process for forming a roll material prepared by photo-curing a liquid photosensitive resin. Further, the present inventors have proposed in Patent Document 5 (WO 03/022594 A) a laser engraving printing original plate using a liquid photosensitive resin composition containing a polymeric material that is a plastomer at 20° C., and proposed a process allowing improvements in which an inorganic porous material is made to coexist to inhibit generation of liquid debris caused by a laser, tack on the surface of the plate is inhibited, and an optical system is prevented from being contaminated. The present inventors have proposed in Patent Document 6 (PCT/JP2004/005839) an apparatus for producing a laser engraving printing original plate using a liquid photosensitive resin composition and a process for producing an original plate using the apparatus.

For a laser engraving process using a cured photosensitive resin, it is highly expected that high-quality printing can be performed as compared to a case where a conventional printing plate by light exposure and development is used because of the advantage that the edge of a formed pattern becomes sharp and thickening of an image by a printing pressure is inhibited, and further, very fine dots can be formed taking advantage of the characteristic such that the focal point of laser light is small, and completion of the technique is strongly desired.

Owing to advancement of a laser engraving apparatus in recent years, it is being made possible to form a sharp edge and very fine dots, but it has become evident that when this is to be achieved in actual printing, there is a problem that should further be solved. More specifically, if the edges of narrow lines and dot parts are sharp as one example, thickening of an image by a printing pressure surely tends to be inhibited, but deformation by the printing pressure tends to occur at the same time, and therefore the sharpened edges do not lead to faithful reproduction in printing. Accordingly, further improvements in mechanical properties of a material are required.

Although the edge of an image on a plate becomes so sharp that fine patterns can be formed, it is not sufficient for achieving high-quality printing, and it is extremely important that the printing plate has mechanical properties such that the accuracy of its plate thickness can be ensured. In the case of a process by laser engraving, a photosensitive resin is first cured before formation of an image by sculpture, and the surface is then subjected to surface processing such as cutting, grinding, polishing and the like, whereby higher thickness accuracy can be ensured as compared to a printing plate by light exposure and development which is generally used today. As a result of examining surface processing processes such as cutting, grinding and polishing further in detail using the aforementioned conventional photosensitive resin composition, the present inventors have found that since sticky debris generated in these processes is deposited on the surface, and deposited sticky debris is hard to be removed, cutting and polishing marks may remain on the surface, and the processing accuracy of the obtained surface becomes so insufficient that a problem arises in printing quality especially when performing precise printing. The above described sticky debris is deposited on the surface of a cutting bite or a grinding wheel, and clings in some cases. It has been found that for avoiding these problems, carefully performing processing, such as stopping working to clean out or remove deposited debris when the sticky debris clings to the cutting bite or the grinding wheel, is required, and therefore a considerable amount of time is required for processing. In addition, as a problem when using a plate of a precise image, it often becomes a serious problem that the image tends to fall off at the time of wiping the plate, or the like.

Thus, it is necessary to improve the mechanical strength so that high-resolution printing as described above can be performed without increasing the hardness of the printing plate because if flexographic printing while making full use of the advantages of good image formability of the letterpress printing plate by laser engraving.

For example, the aforementioned Patent Document 1 (Japanese Patent No. 2846954 (U.S. Pat. No. 5,798,202)) and Patent Document 2 (Japanese Patent No. 2846955 (U.S. Pat. No. 5,804,353)) disclose use of a material prepared by mechanically, photochemically and thermochemically reinforcing a thermoplastic elastomer such as SBS, SIS or SEBS, and provide that the elastomer is mechanically strengthened by adding a filler. However, mixing the filler cannot solve the aforementioned problems, since the hardness of the material is increased at the same time, and so on.

Patent Documents 3 to 6 do not describe the aforementioned problems. Patent Document 4 (JP-A-2002-79645) describes a process for forming a seamless cylinder printing plate for laser engraving, in which in a step of applying light to a liquid photosensitive resin to photo-cure the resin, a light source emitting mainly light having a wavelength of 200 nm to 400 nm is used. As specific light sources, a wide range of light sources including light sources having a relatively high intensity, such as chemical lamps, bactericidal ray lamps, high pressure mercury lamps and metal halides lamps and light sources having a relatively low intensity are listed. However, application of light having a specific high illuminance is not mentioned at all.

As described above, when the laser engraving technique is to be made practicable so that a still higher level of performance is achieved, there has not been a technique allowing mechanical properties to be improved without affecting the hardness of the printing plate among previous material design techniques.

Patent Document 1: Japanese Patent No. 2846954
Patent Document 2: Japanese Patent No. 2846955
Patent Document 3: JP-A-56-64823
Patent Document 4: JP-A-2002-79645
Patent Document 5: WO 03/022594 A
Patent Document 6: PCT/JP2004/005839 Pamphlet

DISCLOSURE OF THE INVENTION

Problems to be Solved by the Invention

It is an object of the present invention to provide an epoch-making process capable of easily reducing the hardness of a printing substrate composed of a cured photosensitive resin obtained by applying light to a photosensitive resin composition and capable of laser engraving, while improving the mechanical properties of the printing substrate.

Measure for Solving the Problem

The present inventors have found that unexpectedly, mechanical properties can considerably be improved without changing a material under a condition of a light source that is used in a photo-curing step, namely by applying high-illuminance light to a photosensitive resin.

That is, the inventors have found that the problems described above can easily be solved by a method for producing a cured photosensitive resin, characterized in that in a step of forming a cured photosensitive resin layer by applying light to a photosensitive resin composition layer formed via a step of forming the photosensitive resin composition layer on a cylindrical support or a sheeted support, light applied to the photosensitive resin composition layer includes light having a wavelength of 200 nm or more and 450 nm or less, and an illuminance of light at a surface of the photosensitive resin composition layer is 20 mW/cm$^2$ or more and 2 W/cm$^2$ or less when measured using a UV meter (trade mark "UV-M02" manufactured by ORC Manufacturing Co., Ltd.) and a filter (trade mark "UV-35-APR Filter" manufactured by ORC Manufacturing Co., Ltd.), and 3 mW/cm$^2$ or more and 2 W/cm$^2$ or less when measured using the above described UV meter and a filter (trade mark "UV-25 Filter" manufactured by ORC Manufacturing Co., Ltd.), and completed the present invention.

The present invention is as follows.

1. A process for producing a laser engravable printing substrate, comprising the steps of: forming a photosensitive resin composition layer on a cylindrical support or a sheeted support; and applying light to the formed photosensitive resin composition layer to form a cured photosensitive resin layer, and then adjusting a thickness of the cured photosensitive resin layer and shaping a surface of the cured photosensitive resin layer, wherein the light applied to the photosensitive resin composition layer includes light having a wavelength of 200 nm or more and 450 nm or less, and an illuminance of light at a surface of the photosensitive resin composition layer is 20 mW/cm$^2$ or more when measured using a UV meter (trade mark "UV-M02" manufactured by ORC Manufacturing Co., Ltd.) and a filter (trade mark "UV-35-APR Filter" manufactured by ORC Manufacturing Co., Ltd.), and 3 mW/cm$^2$ or more when measured using the above described UV meter and a filter (trade mark "(UV-25 Filter" manufactured by ORC Manufacturing Co., Ltd.).

2. The process set forth in item 1, wherein the illuminance of light at a surface of the photosensitive resin composition layer is 20 mW/cm$^2$ or more and 2 W/cm$^2$ or less when measured using a UV meter (trade mark "UV-M02" manufactured by ORC Manufacturing Co., Ltd.) and a filter (trade mark "UV-35-APR Filter" manufactured by ORC Manufacturing Co., Ltd.), and 3 mW/cm$^2$ or more and 2 W/cm$^2$ or less when measured using the UV meter and a filter (trade mark "UV-25 filter" manufactured by ORC Manufacturing Co., Ltd.).

3. The process set forth in item 2, wherein said cured photosensitive resin layer has a thickness of 50 μm or more and 50 mm or less.

4. The process set forth in any one of items 1 to 3, further comprising a step of applying light to the cured photosensitive resin layer again after the step of adjusting the thickness of the above described cured photosensitive resin layer and shaping the surface of the cured photosensitive resin layer, wherein the light applied to the cured photosensitive resin layer again includes light having a wavelength of 200 nm or more and 450 nm or less, and the illuminance of light at the surface of the cured photosensitive resin layer is 20 mW/cm² or more and 2 W/cm² or less when measured using a UV meter (trade mark "UV-M02" manufactured by ORC Manufacturing Co., Ltd.) and a filter (trade mark "UV-35-APR Filter" manufactured by ORC Manufacturing Co., Ltd.), and 3 mW/cm² or more and 2 W/cm² or less when measured using the above described UV meter and a filter (trade mark "UV-25 Filter" manufactured by ORC Manufacturing Co., Ltd.).

5. The process for producing a laser engravable printing substrate set forth in any one of items 1 to 3, wherein the light is applied to the above described photosensitive resin composition layer or cured photosensitive resin layer in the air.

6. The process set forth in any one of items 1 to 3, wherein the temperature of the above described photosensitive resin composition layer or the above described cured photosensitive resin layer is −50° C. or more and 150° C. or less.

7. The process set forth in any one of items 1 to 3, wherein the above described photosensitive resin composition layer is liquid at 20° C.

8. The process set forth in any one of items 1 to 3, wherein the above described photosensitive resin composition layer is solid at 20° C.

9. The process set forth in any one of items 1 to 3, wherein the above described cured photosensitive resin layer is a seamless layer.

10. The process set forth in any one of items 1 to 3, wherein an optical system for collecting light exists between a light source for applying light and the above described photosensitive resin composition layer.

11. The process set forth in any one of items 1 to 3, wherein the printing substrate is a flexographic printing original plate on which a concavo-convex pattern can be formed by applying laser light, a letter press printing original plate, a gravure printing original plate, a screen printing original plate on which a perforated pattern can be formed by applying laser light, or a blanket for offset printing.

12. A printing substrate capable of laser engraving, characterized in that in measurement of dynamic viscoelasticity of a cured photosensitive resin light using a non-resonant force stretch vibration apparatus, a loss tangent (tan δ) defined by a ratio of a loss elastic modulus (E'') to a storage elastic modulus (E') has a peak in a measurement temperature range of −100° C. or more and 20° C. or less, and when tan δ has a peak in a temperature range of −50° C. or more and 20° C. or less, the value of tan δ at the peak temperature is 0.87 or more and 1.5 or less, and when tan δ has a peak in a temperature range of −100° C. or more and less than −50° C., the value of tan δ at the peak temperature is 0.7 or more and to 1.5 or less.

EFFECT OF THE INVENTION

By the process for producing a printing substrate according to the present invention, not only the hardness of a cured photosensitive resin obtained by application of high-illuminance light considerably decreases, but also the breaking strength which is especially important as a printing substrate among mechanical properties is improved, and further, the tensile elongation is improved, whereby the degree of freedom of a technique of designing a material of a photosensitive resin plate that is used in printing is dramatically improved, thus making it possible to obtain a high-performance printing substrate suitable for laser engraving.

BEST MODE FOR CARRYING OUT THE INVENTION

Figure 1:
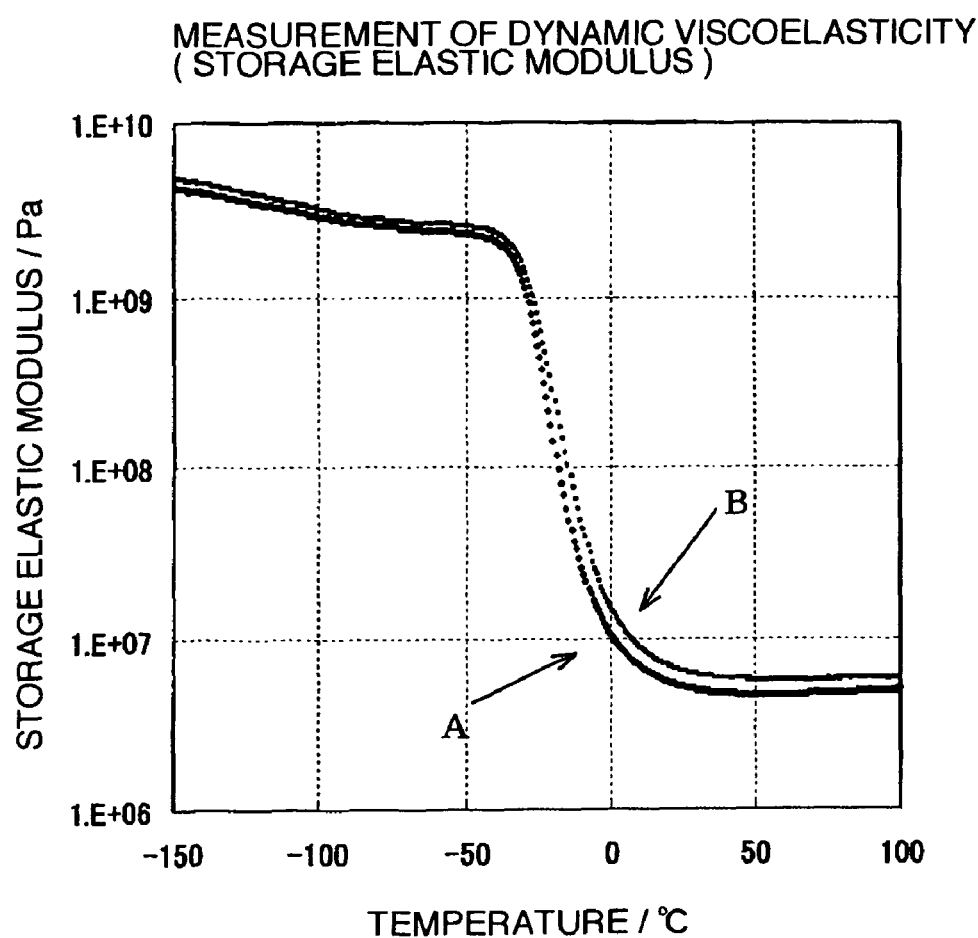
FIG. 1 is a graph showing the dependency on temperature of a storage elastic module in Example 1 and Comparative Example 2.

The present invention will be described in detail below focusing on its preferred embodiments.

A printing substrate of the present invention is a printing substrate formed from a cured photosensitive resin obtained by photo-curing a photosensitive resin composition and capable of laser engraving. The laser engraving is a process for forming a pattern in which a part to which laser light is applied is removed to form a recessed portion.

A process for producing a cured photosensitive resin according to the present invention comprises the steps of: forming a photosensitive resin composition layer on the cylindrical support or a sheeted support; and applying light to the formed photosensitive resin layer to form a cured photosensitive resin layer capable of laser engraving. Further, the process is characterized in that the light applied to the photosensitive resin layer includes light having a wavelength of 200 nm or more and 450 nm or less, and the illuminance of light at the surface of the photosensitive resin layer is 20 mW/cm² or more, preferably 20 mW/cm² or more and 2 W/cm² or less, more preferably 50 mW/cm² or more and 1 W/cm² or less, further preferably 80 mW/cm² or more and 1 W/cm² or less, most preferably 80 mW/cm² or more and 500 mW/cm² or less when measured using a UV meter (trade mark "UV-M02" manufactured by ORC Manufacturing Co., Ltd.) and a filter (trade mark "UV-35-APR Filter" manufactured by ORC Manufacturing Co., Ltd.), and 3 mW/cm² or more, preferably 3 mW/cm² or more and 2 W/cm² or less, more preferably 5 mW/cm² or more and 1 W/cm² or less, further preferably 10 mW/cm² or more and 1 W/cm² or less, most preferably 10 mW/cm² or more and 100 mW/cm² or less when measured using the above described UV meter and a filter (trade mark "UV-25 Filter" manufactured by ORC Manufacturing Co., Ltd.). If the illuminance is within the range described above, the effect of reducing the hardness of the cured photosensitive resin is sufficient, and decomposition or evaporation of components in the photosensitive resin composition during application of light can be avoided. If the illuminance is above the range described above, the effect of reducing the hardness of the photo-cured resin tends to approach a constant value.

The present inventors have found a surprising effect in which by applying light having a high illuminance as described above, not only the curability of the inside and surface of the photosensitive resin composition layer can be ensured, but also the hardness of the obtained photo-cured material can easily be reduced, and further, the breaking strength and the tensile elongation which are especially important among mechanical properties can be improved. The increasing of the hardness of the photo-cured material can relatively easily be achieved by increasing the crosslinking density, but it is extremely difficult to shift the hardness to a lower level because it is necessary to considerably change the type or amount of organic compound having polymer components or polymerizable unsaturated groups in the photosensitive resin composition used, and so on. The reason for this is that other properties such as the solvent resistance, the abrasion resistance and mechanical properties are often considerably degraded if components in the photosensitive resin composition are changed. Therefore, the effect in which a reduction in hardness can easily be achieved by using a light source having a high illuminance provides a significant advantage in terms of the material design, and the effect was surprising. The reduction in hardness does not result from insufficient curing. Namely, the result showing that the breaking strength and the tensile elongation in the mechanical properties of the photosensitive resin composition also supports the fact that curing is not insufficient. This effect was also surprising. The reason for this is presently unknown, but this is presumably because the mechanism of a photopolymerization reaction in the photosensitive resin composition is considerably different for a case where the photo-curing reaction gradually proceeds by low-illuminance light and a case where the photo-curing reaction proceeds in a moment by very high-illuminance light.

In the case of the cured photosensitive resin obtained by applying high-illuminance light, it is easy to remove sticky debris generated in surface processing processes such as cutting, grinding and polishing specific to production of a laser engraving printing substrate, the amount of liquid debris generated during laser graving is small, and a phenomenon in which dot patterns swell and thicken due to generated liquid debris is inhibited.

When measuring the dynamic viscoelasticity of the cured photosensitive resin obtained by rapid photo-curing by application of high-illuminance light, behaviors of a storage elastic modulus (E'), a loss elastic modulus (E") and a loss tangent (tan δ) have been found to be considerably different as compared to the cured photosensitive resin obtained by slow photo-curing by application of low-illuminance light. The loss tangent (tan δ) shows a peak in a range from $-100°$ C. to $20°$ C. for both high-illuminance and low-illuminance systems, and shows a peak in almost the same temperature range for both the systems. For the storage elastic modulus (E'), however, the high-illuminance system of rapid curing by high-illuminance light shows a value that is lower by 20 to 40%. For the loss tangent (tan δ), the high-illuminance system shows a higher value at a peak temperature. For the high-illuminance system, it is suggested that since the storage elastic modulus is low and the loss tangent is high, the density between crosslinking points is low and the molecular weight distribution of the photo-cured material is narrow, namely the lengths of molecular chains after photo-curing are uniform. Thus, a surprising result showing that although the composition of the photosensitive resin composition is the same, the molecular weight distribution of the obtained photo-cured material varies greatly merely with the illuminance of light that is used for photo-curing has been obtained.

In the photo-cured photosensitive resin of the present invention, it is preferable that in measurement of dynamic viscoelasticity using a non-resonant forced stretch vibration apparatus, the loss tangent (tan δ) defined by a ratio of the loss elastic modulus (E") to the storage elastic modulus (E') has a peak in a measurement temperature range from $-100°$ C. or more to $20°$ C. or less, and when tan δ has a peak in a temperature range from $-50°$ C. or more to $20°$ C. or less, the value of tan δ at the peak temperature is 0.87 or more and 1.5 or less, and when tan δ has a peak in a temperature range from $-100°$ C. to less than $-50°$ C., the value of tan δ at the peak temperature is 0.7 or more and 1.5 or less. For broad classification, the photo-cured photosensitive resin in which the peak of tan δ is in a temperature range of $-50°$ C. or more and $20°$ C. or less is a photo-cured photosensitive resin obtained by photo-curing a photosensitive resin composition that is liquid at $20°$ C., and the photo-cured photosensitive resin in which the peak of tan δ is in a temperature range of $-100°$ C. or more and less than $-50°$ C. tends to correspond to a photo-cured photosensitive resin obtained by photo-curing a photosensitive resin composition that is solid at $20°$ C. If tan δ has a peak in a temperature range of $-50°$ C. or more and $20°$ C. or less, the value of tan δ at the peak temperature is preferably 0.87 or more and 1.5 or less, more preferably 0.87 or more and 1.2 or less, further preferably 0.87 or more and 1.0 or less. If tan δ has a peak in a temperature range of $-100°$ C. or more and $-50°$ C. or less, the value of tan δ at the peak temperature is preferably 0.7 or more and 1.5 or less, more preferably 0.7 or more and 1.2 or less, further preferably 0.7 or more and 1.0 or less. If tan δ is within this range, the hardness of the photo-cured material can be reduced, and further, mechanical properties as a printing substrate can be ensured.

Processes for forming a photosensitive resin composition layer on a cylindrical support or a sheeted support include, but are not specifically limited to, a process in which a liquid photosensitive resin composition is coated at $20°$ C., and a process in which a photosensitive resin composition that is solid at $20°$ C. is heated and thereby melted, and extruded onto the above described support using an apparatus such as an extruder, and the thickness is formalized using a calendar roll or the like. For the process in which a liquid photosensitive resin composition is coated, a publicly known process such as the doctor blade process, the spray coat process, the gravure coat process or the spin coat process may be employed.

The formed photosensitive resin composition is crosslinked by application of light to form a cured photosensitive resin. Furthermore, the photosensitive resin composition may be crosslinked by application of light while it is molded. The process of crosslinking the photosensitive resin composition using light is suitable because it has an advantage that the apparatus is simple, the thickness accuracy can be improved, and so on. Light sources that are used for curing may include high-intensity light sources such as metal halide lamps, high pressure mercury lamps, ultrahigh pressure mercury lamps, ultraviolet ray fluorescent lamps, carbon arc lamps and xenon lamps. Light from a plurality of types of light sources may be applied. However, even through a high-intensity light source is used, the illuminance of light that is actually applied to the photosensitive resin composition layer is significantly influenced by the distance between the light source and the photosensitive resin composition layer, the type of glass that is used in the light source, and the presence of a light absorbing film or the like between the light source and the photosensitive resin composition layer, and therefore caution is required.

Generally, in a light exposing apparatus that is used when a resin letterpress plate such as a flexographic printing plate is formed from a photosensitive resin composition, the central wavelength of a lamp used is in the range from 350 nm to 380 nm, and a light source having an extremely narrow wavelength range and a low illuminance such as a chemical lamp in which the wavelength full width at half maximum of the illuminance of emitted light is about 10 nm to 20 nm is generally used. It is conceivable that formation of fine patterns is absolutely necessary, and therefore for the purpose of minimizing influences of variations in refractive index depending on the wavelength of light used, such a light source having a narrow wavelength range was used to achieve solution of this problem. Further, in patterning the printing substrate, a large area is exposed to light at a time, and therefore a light exposure mask film protected from light by a black pattern is generally used. At this time, for fear that the light exposure film may thermally expand due to absorption of heat from the light source, high-illuminance light is generally avoided as light that is applied to the photosensitive resin composition through the light exposure mask film when fine patterns are formed. Particularly when a thickness sensible resin composition that is used during fabrication of the printing substrate is photo-cured to form concavo-convex patterns, use of high-illuminance light is generally avoided in terms of pattern formability and the shape of patterns in formation of fine patterns. For example, an academic literature (The NIK-KAN KOGYO SHIMBUN, LTD., "Electronic Technology", extra edition, June, 1984, p. 132) describes that in a light exposing apparatus for fabrication of print wiring plates on which an ultrahigh pressure mercury lamp having a high intensity of 2 to 5 kW is mounted, the illuminance was as low as 7 to 12 mW/cm$^2$ (value measured using a UV meter (trade mark "UV-M01" manufactured by ORC Manufacturing Co., Ltd.).

As describe previously, JP-A-2002-79645 describes a process for producing a seamless cylinder printing plate for laser engraving. It is described that in a step of applying light to a liquid photosensitive resin to photo-cure the resin, a light source emitting mainly light having a wavelength of 200 nm to 400 nm is used, and a wide range of light sources including light sources having a relatively high intensity, such as chemical lamps, bactericidal ray lamps, high pressure mercury lamps and metal halides lamps and light sources having a relatively low intensity are listed as specific light sources. However, high-intensity light is not mentioned. For the intensity of the light source, there are a wide range of light sources including low-intensity light sources and high-intensity light sources, and commercially available light sources can be obtained. Further, the illuminance generally varies greatly with the distance between the light source and the surface of the photosensitive resin. In a light source that is said to have a relatively high intensity, such as a high pressure mercury lamp or a metal halide lamp, the wavelength of emitted light generally varies greatly with the type of element and gas included in the lamp and the type of glass used for the lamp. Particularly in the metal halide lamp, the wavelength of emitted light can considerably be varied with the type of metallic halide included, and therefore the wavelength of emitted light is not fixed. If a film is coated on the surface of the photosensitive resin, the illuminance of light that can pass through the film due to absorption of light by the film and reach the surface of the photosensitive resin may considerably decrease. Particularly in the case of an aromatic polyester film, light is absorbed in a wavelength range on a side of short wavelengths of 300 nm or less. Light having a wavelength of 300 nm or less may significantly be cut depending on the type and quality of glass that is used for the light source. Further, the illuminance of light reaching the surface of the photosensitive resin composition is considerably influenced by the distance from the light source, the type and quality of optics used, optical components such as, for example, a lens and a mirror, and thus decreases. The illuminance herein refers to the amount of light per unit area, and is generally distinguished from the intensity (or output) that is the total amount of light emitted from the light source. The light source intensity is not synonymous with the illuminance, and the illuminance of light reaching the surface of the photosensitive resin may be low even if a light source having a high intensity is used, and conversely, the illuminance of light reaching the surface of the photosensitive resin can be increased by collecting light even if a light source having a low intensity is used. Thus, the illuminance of light applied to the photosensitive resin is extremely considerably influenced by what light source is used and what optical system is assembled.

As a method for increasing the illuminance using a low-intensity light source, an optical system for collecting light, such as a lens or a concave mirror, is preferably introduced at a position between the light source and the photosensitive resin composition. By using the optical system, even a low-intensity light source can apply high-illuminance light to the photosensitive resin composition.

In the present invention, a shaping step of cutting, polishing and the like to obtain a predetermined thickness may be provided after coating a photosensitive resin composition on a support and applying high-illuminance light to the formed photosensitive resin composition layer to photo-cure the layer. It is more effective to apply high-illuminance light again after the shaping step to process the surface and the inside of the cured photosensitive resin.

In the present invention, the atmosphere in which light is applied to the photosensitive resin composition is preferably a gas atmosphere. Photo-curing in air is especially preferable, and the apparatus for use in application of light can further be simplified.

The temperature of the photosensitive resin composition layer or the cured photosensitive resin layer to which light is applied is preferably −50° C. or more and 150° C. or less, more preferably 0° C. or more and 100° C. or less, further preferably 0° C. or more and 80° C. or less. If the temperature is within the range, the photosensitive resin composition can be molded into a sheet shape or a cylindrical shape in a fixed thickness, and the photosensitive resin composition can be prevented from being decomposed or evaporated during application of light.

Liquid debris generated in a laser engraving step can be absorbed away by including an inorganic porous material (c) in the cured photosensitive resin layer capable of laser engraving. The photosensitive resin composition before being photo-cured preferably contains a resin (a) having a number average molecular weight of 1000 or more and 200000 or less, an organic compound (b) having a number average molecular weight less than 1000 and having a polymerizable unsaturated group in its molecule, and an inorganic porous material (c).

The type of resin (a) may be an elastomer or a non-elastomer, and the resin may be a solid polymer or a liquid polymer at 20° C. When a thermoplastic resin is used, it is contained in an amount of 30 wt % or more, preferably 50 wt % or more, further preferably 70 wt % or more of the total weight of the polymer. If the content of the thermoplastic resin is 30 wt % or more, the resin is sufficiently fluidized by application of a laser beam, and therefore absorbed by the inorganic porous material described later. If a resin of which the softening temperature is more than 300° C. is used, there is the concern that other organic materials are degenerated or decomposed by heat because the temperature at which the resin is molded into a cylindrical shape becomes inevitably higher, and therefore a solvent-soluble resin is preferably coated and used in a state of being dissolved in a solvent.

Particularly in terms of ease of processing into a cylindrical resin plate and ease of decomposition with heat, a polymer that is liquid at 20° C. is preferably used as the resin (a). When a polymer that is liquid at 20° C. is used as the resin (a), the formed photosensitive resin composition is also liquid, and therefore the resin can be melted at a low temperature.

The number average molecular weight of the resin (a) for use in the present invention is preferably in the range from 1000 to 200000. A more preferable is a range from 5000 to 100000. If the number average molecular weight is within the range from 1000 to 200000, the mechanical strength of the printing original plate can be ensured, and the resin can sufficiently be melted or decomposed during laser engraving. The number average molecular weight in the present invention is a value measured using gel permeation chromatography (GPC) and evaluated with reference to a polystyrene authentic sample of which the molecular weight is known.

For the resin (a) used, a resin that is easily liquefied or easily decomposed is preferable. The resin that is easily decomposed preferably contains styrene, α-methyl styrene, α-methoxystyrene, acrylic esters, methacrylic esters, ester compounds, ether compounds, nitro compounds, carbonate compounds, carbamoyl compounds, hemiacetal ester compounds, oxyethylene compounds, aliphatic cyclic compounds or the like in a molecular chain as a monomer unit that is easily decomposed. Particularly, polyethers such as polyethylene glycol, polypropylene glycol and polytetraethylene glycol, aliphatic polycarbonates, aliphatic carbamates, polymethyl methacrylate, polystyrene, nitrocellulose, polyoxyethylene, polynorbornen, hydrogenated polycyclohexadienes, or polymers having a molecular structure such as a dendolymer having a large number of branched structures are typical examples of resins that are easily decomposed. Polymers containing a large number of oxygen atoms in a molecular chain are preferable in terms of decomposability. Among them, compounds having a carbonate group, a carbamate group and a methacryl group in a polymer main chain have high heat decomposability and are therefore preferable. For example, polyesters and polyurethanes synthesized using (poly)carbonatediol and (poly)carbonate dicarboxylic acid as raw materials, and polyamides synthesized using (poly)carbonate diamine as a raw material may be listed as examples of polymers having good heat decomposability. Compounds containing polymerizable unsaturated groups in main chains and side chains of these polymers may be used. Particularly, if there is a reactive functional group such as a hydroxyl group, an amino group or a carboxyl group at the end, a polymerizable unsaturated group is easily introduced at the end of a main chain.

Thermoplastic elastomers for use in the present invention may include, but are not specifically limited to, SBS (polystyrene-polybutadiene-polystyrene), SIS (polystyrene-polyisoprene-polystyrene), SEBS (polystyrene-polyethylene/polybutylene-polystyrene) and the like as styrene thermoplastic elastomers, olefin thermoplastic elastomers, urethane thermoplastic elastomers, ester thermoplastic elastomers, amide thermoplastic elastomers and silicone thermoplastic elastomers. A polymer having an easily decomposable functional group such as a highly decomposable carbamoyl group or carbonate group introduced in a main chain in a molecular bone for further improving the heat decomposability may also be used.

The elastomer may be mixed with a polymer having higher heat decomposability and used. The thermoplastic elastomer is fluidized by heating, and therefore can be mixed with an organic porous material that is used in the present invention. The thermoplastic elastomer is a material which is fluidized by heating, can be molded and processed like a usual thermoplastic plastic, and shows rubber elasticity. A molecular structure consists of a soft segment such as a polyether or a rubber molecule and a hard segment preventing plastic deformation like a vulcanized rubber at near normal temperature, and for the hard segment, there are a variety of types such as a frozen phase, a crystalline phase, a hydrogen bond and an ion crosslink.

The type of thermoplastic elastomer may be selected according to the application of the printing plate. For example, in a field where the solvent resistance is required, urethane, ester, amide and fluorine thermoplastic elastomers are preferable, and in a filed where the heat resistance is required, urethane, olefin, ester and fluorine thermoplastic elastomers are preferable. The hardness can be varied greatly with the type of thermoplastic elastomer. In the application for a usual printing plate, the Shore A hardness is in the range from 20 to 75 degrees, and in the application of embossing for forming surface concavo-convex patterns of papers, films and building materials or letterpress printing, a relatively hard material is required, and in this case, the Shore D hardness is in the range from 30 to 80 degrees.

Non-elastomer thermoplastic resins may include, but are not specifically limited to, polyester resins, unsaturated polyester resins, polyamide resins, polyamide imide resins, polyurethane resins, unsaturated polyurethane resins, polysulfone resins, polyethersulfone resins, polyimide resins, polycarbonate resins and fully aromatic polyester resins.

The softening temperature of the thermoplastic resin of the present invention is preferably 50° C. or more and 300° C. or less. More preferable is a range from 80° C. or more and 250° C. or less, and further preferable is a range from 100° C. or more and 200° C. or less. If the softening temperature is 50° C. or more, the resin can be handled as a solid at normal temperature, and the resin processed into a sheet shape or a cylindrical shape can be handled without being deformed. If the softening temperature is 300° C. or less, it is not necessary to heat the resin to an extremely high temperature when processing the resin into a cylindrical shape, and degradation or decomposition of other compounds mixed is thus avoided. For measurement of the softening temperature of the present invention, a dynamic viscoelasticity measuring apparatus is used, and the softening temperature is defined as an initial temperature at which the viscosity coefficient is sharply changed (the gradient of a viscosity coefficient curve is changed) when the temperature is elevated from room temperature.

The resin (a) of the present invention may be a solvent-soluble resin. Specifically, solvent-soluble resins may include polysulfone resins, polyethersulfone resins, epoxy resins, alkyd resins, polyolefin resins and polyester resins.

The resin (a) of the present invention may have a polymerizable unsaturated group having a high reactivity at the end or side chain of the molecular chain. If a polymer having a polymerizable unsaturated group having a high reactivity is used, a printing original plate having an extremely high mechanical strength can be fabricated. Particularly, in the polyurethane and polyester thermoplastic elastomers, a polymerizable unsaturated group having a high reactivity can relatively easily be introduced to the inside of a molecule. The inside of a molecule mentioned herein includes a case where a polymerizable unsaturated group is directly attached at the end of the polymer main chain, at the end of the polymer side chain, or in the polymer main or side chain, and so on. For example, a resin having a polymerizable unsaturated group directly introduced at the end of the molecule may be used, but suitable alternative methods include a method in which a compound with a molecular weight of several thousands having a plurality of reactive groups such as hydroxide groups, amino groups, epoxy groups, carboxyl groups, acid anhydride groups, ketone groups, hydrazine groups, isocyanate groups, isothiocyanate groups, cyclic carbonate groups, ester groups and the like are reacted with a binder (e.g. polyisocyanate in the case of hydroxyl groups and amino groups) having a plurality of groups capable of binding to the reactive group of the component, adjustment of the molecular weight and conversion into a binding group at the end are carried out, and the reaction product is then reacted with an organic compound having a group reacting with this binding group at the end and a polymerizable unsaturated group to introduce the polymerizable unsaturated group at the end.

The organic compound (b) is a compound having an unsaturated bond involved in a radical or addition polymerization reaction, and its number average molecular weight is preferably less than 1000 in consideration of ease of dilution with the resin (a). Functional groups having an unsaturated bond involved in the radical polymerization reaction include a vinyl group, an acetylene group, an acryl group, a methacryl group and an allyl group as preferable examples. Functional groups having an unsaturated bond involved in the addition polymerization reaction may include a cynnamoil group, a thiol group, an azido group, an epoxy group that undergoes a ring-opening addition reaction, an oxethane group, a cyclic ester group, a dioxilane group, a spiroortho carbonate group, a spiroortho ester group, bisycloortho ester group, a cyclosiloxane group and a cyclic iminoether group.

Specific examples of the organic compound (b) include olefins such as ethylene, propylene, styrene and divinyl benzene, acetylenes, (meta)acrylic acids and derivatives thereof, haloorefins, unsaturated nitriles such as acrylonitrile, (meta) acryl amides and derivatives thereof, allyl compounds such as allyl alcohol and allyl isocyanate, unsaturated dicarboxylic acids such as maleic anhydride, maleic acid and fumaric acid and derivatives thereof, vinyl acetates, N-vinyl pyrolidone and N-vinylcarbazole. (Meta)acrylic acids and derivatives thereof are preferable examples in terms of abundance in the type, the price, decomposability during application of laser light, and so forth. The derivatives include alicyclic compounds having a cycloalkyl group, a bicycloalkyl group, a cycloalkene group, a bicycloalkene group and the like, aromatic compounds having a benzyl group, a phenyl group, a phenoxy group, a fluorine bone and the like, compounds having an alkyl group, a halogenated alkyl group, an alkoxy alkyl group, a hydroxy alkyl group, an amino alkyl group, a glycidyl group and the like, and ester compounds with polyvalent alcohols such as alkylene glycol, polyoxyalkylene glycol, polyalkylene glycol and trimethylol-propane.

Compounds having an epoxy group that undergoes an addition polymerization reaction, as the organic compound (b), may include compounds obtained by making epichloro hydrin react with various kinds of polyols such as diol and triol, and epoxy compounds obtained by making a peracid react with an ethylene bond in a molecule. Specific examples include ethylene glycol diglycidyl ether, diethylene glycol diglycidyl ether, triethylene glycol diglycidyl ether, tetraethylene glycol diglycidyl ether, polyethylene glycol diglycidyl ether, propylene glycol diglycidyl ether, tripropylene glycol diglycidyl ether, polypropylene glycol diglycidyl ether, neopentyl glycol diglycidyl ether, 1,6-hexanediol diglycidyl ether, glycerin diglycidyl ether, glycerin triglycidyl ether, trimethylol propane triglycidyl ether, Bisphenol A diglycidyl ether, hydrogenated Bisphenol A diglycidyl ether, diglycidyl ethers of compounds with ethylene oxide or propylene oxide added to Bisphenol A, polytetramethylene glycol diglycidyl ether, poly(propylene glycol adipate)diol diglycidyl ether, poly(ethylene glycol adipate)diol diglycidyl ether and poly (caprolactone)diol diglycidyl ether.

In the present invention, one or more types of organic compounds (b) having these polymerizable unsaturated bonds may be selected according to the purpose thereof. For example, if the compound is used for a printing plate, at least one type of long-chain aliphatic, alicyclic or aromatic derivative is preferably included as the organic compound (b) which is used for suppressing swelling by an organic solvent such as an alcohol or an ester that is a solvent for a printing ink.

For improving the mechanical strength of printing original plate obtained from the resin composition of the present invention, at least one alicyclic or aromatic derivative is preferably included as the organic compound (b). In this case, the amount of derivative is preferably 20 wt % or more, further preferably 50 wt % or more based on the total amount of organic compound (b). The above described aromatic derivative may be an aromatic compound having elements such as nitrogen and sulfur.

For improving the rebound resilience of the printing plate, a methacryl monomer described in, for example, JP-A-7-239548 may be used, or a selection may be made using technical information of publicly known photosensitive resins for printing, and so forth.

In the application where the solvent resistance is required, the resin (a) and/or the organic compound (b) of the present invention is preferably a compound having in a molecular chain at least one type of bond selected from the group consisting of carbonate bonds, ester bonds and ether bonds, and/ or having at least one type of molecular chain selected from the group consisting of aliphatic saturated hydrocarbon chains and aliphatic unsaturated hydrocarbon chains and having an urethane bond. Among them, compounds having carbonate bonds or compounds having aliphatic hydrocarbon chains show an especially high solvent resistance to ester solvents that are often used in solvent inks.

The inorganic porous material (c) is inorganic particles having very small pores or very small air gaps in particles. The inorganic porous material (c) is an additive for absorbing away sticky liquid debris generated in a large amount in laser engraving, and also has an effect of preventing tack on the plate surface. In addition to the requirement that it should not be melted by laser application, the quality is not specifically limited, but when photo-curing is performed using an ultraviolet ray or a visible light ray, the transmittance of light into the photosensitive resin composition considerably decreases to cause a degradation in properties of the cured material if black fine particles are added, and therefore black fine particles such as carbon black, activated carbon and graphite are not suitable as the inorganic porous material (c) of the present invention.

The pore volume of the inorganic porous material (c) is preferably 0.1 ml/g or more and 10 ml/g or less, more preferably 0.2 ml/g or more and 5 ml/g or less. If the pore volume is 0.1 m/g or more, the absorption of sticky liquid debris is sufficient, and if the pore volume is 10 ml/g or less, the mechanical strength of particles can be ensured. In the present invention, a nitrogen absorption method is used for measurement of the pore volume. The pore volume in the present invention is determined from an absorption isotherm of nitrogen at $-196°$ C.

The average pore diameter of the inorganic porous material (c) very greatly influences the absorption of liquid debris generated during laser engraving. The range of the average pore diameter is preferably from 1 nm or more to 1000 nm or less, more preferably from 2 nm or more to 200 nm or less, further preferably from 2 nm or more to 50 nm or less. If the average pore diameter is 1 nm or more, the absorption of liquid debris generated during laser engraving can be ensured, and if the average pore diameter is 1000 nm or less, the specific surface areas of particles are so large that the absorption of liquid debris can sufficiently be ensured. The reason why the absorption of liquid debris is low if the average pore diameter is less than 1 nm has not been clarified, but it can be assumed that liquid debris is sticky and therefore hard to enter a micropore. The average pore diameter of the present invention is a value measured using a nitrogen adsorption method. Pores having an average pore diameter of 2 to 50 nm are particularly called mesopores, and porous particles having mesopores have an extremely high capability of absorbing liquid debris. The pore diameter distribution in the present invention is determined from an absorption isotherm of nitrogen at $-196°$ C.

The present invention has the most striking characteristic in introduction of a new concept absent in previous technological ideas that a resin having a relatively low molecular weight is employed so that it is easily cut preferably by application of a laser, and resultantly, low-molecular weight monomers and oligomers are generated in a large amount when molecules are cut, and therefore this sticky liquid debris is removed using a porous inorganic absorbent. For effectively removing sticky liquid debris, the properties such as the number average particle diameter of the inorganic porous material, the specific surface area, the average pore diameter, the pore volume, the ignition loss and the oil absorption of the inorganic porous material are important factors.

The inorganic porous material (c) preferably has a number average particle diameter of 0.1 to 100 μm. If an inorganic porous material having a number average particle diameter below this range is used, powder dust tends to fly to contaminate a sculpture apparatus when an original plated obtained from the resin composition of the present invention is sculptured, and in addition, a rise in viscosity, entanglement of air bubbles and generation of power dust tend to occur when the inorganic porous material is mixed with the resin (a) and the organic compound (b). If an inorganic porous material having a number average particle diameter above the aforementioned range is used, defects tend to occur in relief images at the time of laser engraving, and the fineness of printed matters tends to be impaired. A more preferable range of the average particle diameter is from 0.5 to 20 μm, and a further preferable range is from 3 to 10 μm. The average particle diameter of the inorganic porous material for use in the present invention can be measured using a laser scattering particle diameter distribution measuring apparatus.

A new concept of a degree of porosity is introduced in evaluation of properties of the porous material. The degree of porosity is defined by a ratio of a specific surface area P to a surface area S per unit weight that is calculated from an average particle diameter D (unit: μm) and a density d (unit: g/cm$^3$) of a material forming particles, namely P/S. Since the surface area per particle is $\pi D^2 \times 10^{-12}$ (unit: m$^2$) and the weight per particle is $(\pi D^3 d/6) \times 10^{-12}$ (unit: g), the surface area S per unit weight is $S=6/(Dd)$ (unit: m$^2$/g). For the specific surface area P, a value measured with nitrogen molecules adsorbed to the surface is used.

The degree of porosity of the inorganic porous material (c) is preferably 20 or more, more preferably 50 or more, further preferably 100 or more. If the degree of porosity is 20 or more, liquid debris is effectively absorbed away. Since the specific surface area P increases as the particle diameter decreases, the specific area alone is not suitable as an index showing the properties of the porous material. Therefore, the degree of porosity is employed as an index which considers the particle diameter and is made dimensionless. For example, carbon black that is widely used as a reinforcement material for rubber and the like has a very large specific surface area of 150 m$^2$/g to 20 m$^2$/g but has an extremely small average particle diameter which is usually 10 nm to 100 nm, and therefore when the degree of porosity is calculated provided that the density is 2.25 g/cm$^3$ for graphite, the obtained value is in a range from 0.8 to 1.0, and carbon black is presumed to be a nonporous material having no porous structures in particles. Since carbon black is generally known to have a graphite structure, a value for graphite is used for the above described density. The degree of porosity of porous silica that is used in the present invention has a high value well exceeding 500.

The inorganic porous material of the present invention preferably has a specified specific surface area and oil absorption for obtaining a further satisfactory absorption.

The range of the specific surface area of the inorganic porous material (c) is preferably from 10 m$^2$/g or more to 1500 m$^2$/g or less, more preferably from 100 m$^2$/g or more to 800 m$^2$/g or less. If the specific surface area is 10 m$^2$/g or more, removal of liquid debris during laser engraving is sufficient, and the specific surface area is 1500 m$^2$/g or less, a rise in viscosity of the photosensitive resin composition can be inhibited and thixotropy can be inhibited. The specific surface area in the present invention is determined based on the BET equation from an absorption isotherm of nitrogen at $-196°$ C.

There is an oil absorption as an index for evaluating the absorption of liquid debris. This is defined by the amount of oil absorbed by 100 g of inorganic porous material. The range of the oil absorption of the inorganic porous material for use in the present invention is preferably from 10 ml/100 g or more to 2000 ml/100 g or less, more preferably from 50 ml/100 g or more to 1000 ml/100 g or less, further preferably from 200 ml/100 g or more to 800 ml/100 g or less. If the oil absorption is 10 ml/100 g or more, liquid debris generated during laser engraving is effectively removed, and if the oil absorption is 2000 ml/100 g or less, the mechanical strength of the inorganic porous material can sufficiently be ensured. The measurement of the oil absorption is preferably carried out in accordance with JIS-K5101.

The inorganic porous material (c) of the present invention preferably retains porosity without being deformed or melted by application of laser light particularly in an infrared wavelength range. The ignition loss after processing at 950° C. for 2 hours is preferably 15 wt % or less, more preferably 10 wt % or less.

The shape of particles of the inorganic porous material is not specifically limited, and spherical particles, flat particles, acicular particles, amorphous particles, particles having projections on the surfaces, or the like may be used. Among them, spherical particles are especially preferable in terms of the abrasion resistance of the printing plate. Hollowed particles, spherical granules having uniform pore diameters, such as a silica sponge, and the like can also be used. Examples thereof may include, but are not specifically limited to, porous silica, mesoporous silica, silica-zirconia porous gel, mesoporous molecular sieve, porous alumina and porous glass.

For materials having air gaps of several nm to 100 nm between layers, such as layered clay compounds, the pore diameter cannot be defined, and therefore air gaps existing between layers, namely face intervals are defined as a pore diameter. The total amount of spaces existing between layers is defined as a pore volume. These values can be determined from the absorption isotherm of nitrogen.

Further, an organic coloring matter such as a pigment or a dye absorbing light having a wavelength of laser light can be captured in these pores or air gaps.

The sphericity is defined as an index for specifying spherical particles. The sphericity for use in the present invention is defined by a ratio of a maximum value $D_1$ of a circle fully encompassed within a projected view to a minimum value $D_2$ of a circle fully encompassing the projected view ($D_1/D_2$) when particles are projected. In the case of a sphere, the sphericity is 1.0. The sphericity of spherical particles for use in the present invention is preferably 0.5 or more and 1.0 or less, more preferably 0.7 or more and 1.0 or less. If the sphericity is 0.5 or more, the abrasion resistance as a printing plate is satisfactory. The sphericity of 1.0 is an upper limit of the sphericity. As spherical particles, 70% or more, more preferably 90% or more of particles desirably have a sphericity of 0.5 or more. As a method for measuring the sphericity, a method in which the sphericity is measured based on a photograph taken using a scanning electron microscope may be used. At this time, a photograph is preferably taken under a magnification allowing at least 100 particles to be encompassed with in a monitor screen. The above described $D_1$ and $D_2$ are measured based on a photograph, but preferably, the photograph is processed using an apparatus such as a scanner for digitizing the photograph, and data is then processed using image analysis software.

The surface of the inorganic porous material may be coated with a silane coupling agent, titanium coupling agent or other organic compound to perform a surface modification treatment to use more hydrophilic or hydrophobic particles.

In the present invention, one or more types of the inorganic porous material (c) may be selected, and by adding the inorganic porous material (c), generation of liquid debris during laser engraving is inhibited and tacks and the like on the relief printing plate are improved effectively.

In the photosensitive resin composition of the present invention, usually, the amount of organic compound (b) is preferably in a range from 5 to 200 parts by weight, more preferably in a range from 20 to 100 parts by weight based on 100 parts by weight of resin (a). The amount of inorganic porous material (c) is preferably in a range from 1 to 100 parts by weight, more preferably in a range from 2 to 50 parts by weight, further preferably in a range from 2 to 20 parts by weight.

If the ratio of the organic compound (b) is within the aforementioned range, the hardness and the tensile strength elongation are easily balanced, shrinkage in crosslinkage curing is reduced, and the thickness accuracy can be ensured.

If the amount of inorganic porous material (c) is within the aforementioned range, the effect of preventing tacks on the surface of the plate and the effect of inhibiting generation of sculpture liquid debris at the time of laser engraving, and so on are sufficiently exhibited, the mechanical strength of the printing plate can be ensured, and the transparency can be retained. When the inorganic porous material (c) is used for a flexographic plate, the hardness can be controlled so as not to be too high. When the photosensitive resin composition is cured using light, especially ultraviolet light, to fabricate a laser engraving printing original plate, the light transmission property influences a curing reaction. Thus, it is effective to use an inorganic porous material having a refractive index close to that of the photosensitive resin composition.

The photosensitive resin composition of the present invention is crosslinked by application of light or an electron beam to realize properties as a printing plate or the like, and at this time, a polymerization initiator may be added. The polymerization initiator may be selected from those that are generally used, and for example, initiators for radical polymerization, cationic polymerization and anionic polymerization illustrated in "Polymer Data Handbook—Basic Part" edited by The Society of Polymer Science, Japan; published by BAIFUKAN CO., LTD., 1986, may be used. Crosslinking the resin composition by photopolymerization using a photopolymerization initiator is useful as a method allowing printing original plates to be produced with good productivity while maintaining the storage stability of the resin composition of the present invention, and a publicly known initiator may be used as an initiator that is used in this case. For the photopolymerization initiator inducing a radical polymerization reaction, hydrogen extraction photopolymerization initiators and collapse photopolymerization initiators are widely used as especially effective photopolymerization initiators. For photo-curing in air, it is especially preferable that a hydrogen extraction photopolymerization initiator and a collapse photopolymerization initiator are used in combination.

The hydrogen extraction polymerization initiator is not specifically limited, but aromatic ketone is preferably used. Aromatic ketone goes into an excitation triplet state efficiently by optical excitation, and for this excitation triplet state, a chemical reaction mechanism in which hydrogen is extracted from surrounding media to generate radicals has been proposed. It is conceivable that the generated radicals are involved in a photo-crosslinking reaction. The hydrogen extraction photopolymerization initiator for use in the present invention may be any compound as long as it extracts hydrogen from surrounding media to generate radicals via the excitation triplet state. Aromatic ketones may include benzophenones, Michler's ketones, xanthenes, thioxanthones and anthraquinones, and at least one type of compound selected from the group consisting of these compounds is preferably used. Benzophenones refer to benzophenone and derivatives thereof, specific examples of which include 3,3',4,4'-benzophenonetetracarboxylic anhydride and 3,3',4,4'-tetramethoxybenzophenone. Michler's ketones refer to Michler's ketone and derivatives thereof. Xanthenes refer to xanthene and derivatives substituted with an alkyl group, a phenyl group and a halogen group. Thioxanthones refer to thioxanthone and derivatives substituted with an alkyl group, a phenyl group and a halogen group, which may include ethylthioxanthone, methylthioxanthone and chlorothioxanthone. Anthraquinones refer to anthraquinone and derivatives substituted with an alkyl group, a phenyl group, a halogen group and the like. The added amount of hydrogen extraction photopolymerization initiator is preferably 0.1 wt % or more and 10 wt % or less, more preferably 0.5 wt % or more and 5 wt % or less of the total amount of photosensitive resin composition. If the added amount is within this range, the curability of the surface of the cured material can sufficiently be ensured and the weather resistance can be ensured when a liquid photosensitive resin composition is photo-cured in air.

The collapse photopolymerization initiator refers to a compound in which after absorption of light, a cleavage reaction occurs in a molecule and active radicals are generated, and is not specifically limited. Specific examples thereof may include benzoinalkyl ethers, 2,2-dialkoxy-2-phenyl acetophenones, acetophenones, acyloxime esters, azo compounds, organic sulfur compounds and diketones, and at least one compound selected from the group consisting of these compounds is preferably used. Benzoinalkyl ethers may include benzoinisopropyl ether, benzoinisobutyl ether, compounds described in "Photosensitive Polymers" (Kodansha Co., Ltd., published in 1977, p. 228). 2,2-dialkoxy-2-phenyl acetophenones may include 2,2-dimethoxy-2-phenyl acetophenone and 2-2-diethoxy-2-phenyl acetophenone.

Acetophenones may include acetophenone, trichloro acetophenone, 1-hydroxycyclohexyl acetophenone and 2,2-diethoxy acetophenone. Acyloxime esters may include 1-phenyl-1,2-propanedione-2-(o-benzoyl)oxime. Azo compounds may include azobis isobutyronitorile, diazonium compounds and tetrazene compounds. Organic sulfur compounds may include aromatic thiol, mono and disulfide, thiuram sulfide, dithiocarbamate, S-acyl dithiocarbamate, thiosulfonate, sulfoxide, sulphenate and dithiocarbonate. Diketones may include benzyl and methyl benzoyl formate. The added amount of collapse photopolymerization initiator is preferably 0.1 wt % or more and 10 wt % or less, more preferably 0.3 wt % or more and 3 wt % or less of the total amount of the photosensitive resin composition. If the added amount is within this range, the curability of the inside of the cured material can sufficiently be ensured when the photosensitive resin composition is photo-cured in air.

A compound having in the same molecule a site functioning as the hydrogen extraction photopolymerization initiator and a site functioning as the collapse photopolymerization initiator may also be used as a photopolymerization initiator. Examples thereof may include α-aminoacetophenones. They may include, for example, 2-methyl-1-(4-methylthiophenyl)-2-morpholino-propane-1-one and compounds expressed by the general formula (1).

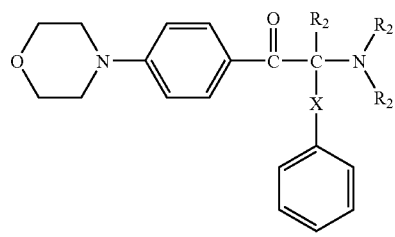

[Formula 1]          (1)

(In the formula, $R_2$ each independently represents a hydrogen atom or an alkyl group having 1 to 10 carbon atoms. X represents an alkylene group having 1 to 10 carbon atoms.)

The added amount of the compound having in the same molecule a site functioning as the hydrogen extraction photopolymerization initiator and a site functioning as the collapse photopolymerization initiator is preferably 0.1 wt % or more and 10 wt % or less, more preferably 0.3 wt % or more and 3 wt % or less of the total amount of the photosensitive resin composition. If the added amount is within this range, the mechanical properties of the cured material can sufficiently be ensured even when the photosensitive resin composition is photo-cured in air.

A photopolymerization initiator inducing an addition polymerization reaction by absorbing light and generating an acid may also be used. Examples of the photopolymerization initiator include photo-cationic polymerization initiators such as aromatic diazonium salts, aromatic iodonium salts and aromatic sulfonium salts, or polymerization initiators absorbing light and generating a base. The added amount of the photopolymerization initiator is preferably in a range from 0.1 wt % or more to 10 wt % or less of the total amount of photosensitive resin composition.

In addition, to the resin composition of the present invention may be added a polymerization inhibitor, an ultraviolet absorbing agent, a dye, a pigment, a lubricant, a surfactant, a plasticizer, a flavor and the like may be added according to the application and purpose.

For the method for molding the photosensitive resin composition of the present invention into a cylindrical shape, an existing method for molding resins may be used. Examples of the method may include a cast molding method, and a method in which a resin is extruded from nozzles or dies by a machine such as a pump or an extruder, and calendered by a roll for making the thickness uniform by a blade to make the thickness uniform. In this case, it is also possible to carry out molding while heating the resin within the bounds not degrading the performance of the resin. The resin may also be subjected to rolling, grinding and the like as necessary. Furthermore, a printing plate can be formed using a cylindrical printing original plate formation/sculpture apparatus having a laser light source for laser engraving incorporated in an apparatus curing/solidifying a photosensitive resin composition by applying light after coating the photosensitive resin composition on a cylindrical support. If such an apparatus is used, laser engraving can be carried out to form a printing plate just after forming a cylindrical printing original plate, thus making it possible to realize short-time processing far beyond what can be conceived for a conventional rubber sleeve requiring a period of several weeks for molding. In a step of fabricating a cylindrical printing original plate, the cylindrical printing original plate can be fabricated in an extremely short time by using the photosensitive resin composition.

The cylindrical support for use in the present invention may be rigid or flexible. It may also be sheeted support. The role of the support for use in the present invention is to ensure the dimensional stability of the printing original plate. Thus, a support having high dimensional stability is preferably selected. When an evaluation is made using a linear expansion coefficient, the upper limit for a preferable material is 100 ppm/° C. or less, further preferably 70 ppm/° C. or less. Specific examples of the material may include polyester resins, polyimide resins, polyamide resins, polyamide imide resins, polyether imide resins, polybismaleimide resins, polysulfone resins, polycarbonate resins, polyphenylene ether resins, polyphenylene thioether resins, polyether sulfone resins, liquid crystal resins composed of fully aromatic polyester resins, fully aromatic polyamide resins, epoxy resins and metals. These resins may also be laminated and used.

Methods for reducing the linear expansion coefficient of the support may include a method in which a filler is added, and a method in which a meshed cloth of fully aromatic polyamide or the like, a glass cloth, or the like is impregnated or coated with a resin. For the filler, organic fine particles that are usually used, inorganic fine particles such as metal oxides or metals, organic/inorganic composite fine particles and the like may be used. Porous fine particles, hollowed fine particles, microcapsule particles, and layered compound particles with a low-molecular compound intercalated therein may also be used. Particularly, fine particles of metal oxides such as alumina, silica, titanium oxide and zeolite, latex fine particles composed of a polystyrene/butadiene copolymer, organic fine particles and fibers of natural products such as highly crystalline celluloses and highly cellulose nanofibers produced by organisms, and the like are useful. Materials such as fiber reinforcement plastics (FRP) are especially useful for the cylindrical support.

By chemically and physically treating the surface of the cylindrical or sheet support for use in the present invention, the adhesion of the support with a cushion layer can be improved. Physical treatment methods may include a sand blast method, a wet blast method of jetting a liquid containing fine particles, a corona discharge treatment method, a plasma treatment method, and ultraviolet ray or vacuum ultraviolet ray irradiation method. Chemical treatment methods include a strong acid/strong alkali treatment method, an oxidant treatment method and a coupling treatment method.

The thickness of the cured photosensitive resin layer capable of laser engraving may freely be set according to the purpose of use, but it is generally in a range from 0.1 to 7 mm when the cured photosensitive resin layer is used for a printing plate. In some cases, a plurality of materials having different compositions may be laminated.

The printing original plate capable of laser engraving of the present invention is preferably a printing original plate formed by photo-crosslinking and curing a photosensitive material containing inorganic porous material fine particles. Thus, a three-dimensionally crosslinked structure is formed by a reaction of a polymerizable unsaturated group of the organic compound (b) or a polymer with the polymerizable unsaturated group of the organic compound (b), and the photosensitive material becomes insoluble in ester, ketone, aromatic, ether, alcohol and halogen solvents that are usually used. This reaction occurs between organic compounds (b), between resins (a) or between the resin (a) and the organic compound (b), and the polymerizable unsaturated group is consumed. When the photosensitive material is crosslinked and cured using a photopolymerization initiator, the photopolymerization initiator is decomposed by light, and therefore an unreacted photopolymerization initiator and a decomposition product can be identified by extracting the crosslinked and cured material with a solvent and performing analysis using the GC-MS method (method of performing mass analysis of a substance separated by gas chromatography), the LC-MS method (method of performing mass analysis of a substance separated by liquid chromatography), the GPS-MS method (separating a substance by gel permeation chromatography and performing mass analysis of the substance) or the LC-NMR method (separating a substance by a liquid chromatography and performing analysis of the substance by a nuclear magnetic resonance spectrum. Further, by using the GPC-MS method, the LC-MS method or the GPC-NMR method, an unreacted resin (a), an unreacted organic compound (b) and a relatively low molecular weight product obtained by a reaction of a polymerizable unsaturated group in a solvent extracted material can be identified from analysis of the solvent extracted material. For solvent-insoluble high molecular weight components forming the three-dimensionally crosslinked structure, whether a site generated by the reaction of the polymerizable unsaturated group is present as a component forming the high molecular weight material can be verified by using the pyrolysis GC-MS method. For example, the presence of a site by the reaction of a polymerizable unsaturated group such as a methacrylate group, an acrylate group or a vinyl group can be predicted from a mass analysis spectrum pattern. The pyrolysis GC-MS method is a method in which a sample is decomposed by heating, generated gas components are separated by gas chromatography, and mass analysis is then performed. If a decomposition product originating from the photopolymerization reaction or an unreacted photopolymerization initiator is detected together with an unreacted polymerizable unsaturated group or a site obtained by the reaction of the polymerizable unsaturated group in the crosslinked and cured material, it can be concluded that this material has been obtained by photo-crosslinking and curing the photosensitive resin composition.

The amount of inorganic porous material fine particles present in the crosslinked and cured material can be obtained by heating the crosslinked and cured material in air to burn off organic components and measuring the weight of residues.

The presence of inorganic porous material fine particles in the above described residues can be identified from observation of the morphology by a field emission high-resolution scanning electron microscope, and measurements of a particle diameter distribution by a laser scattering particle diameter distribution measuring apparatus and a pore volume, a pore diameter distribution and a specific surface area by a nitrogen adsorption method.

In laser engraving, a laser apparatus is operated using a computer with an image to be formed as digital data, and a relief image is created on an original plate. The laser for use in laser engraving may be any laser as long as it includes a wavelength at which the original plate has an absorption. For performing sculpture at a high speed, a laser having a high output is desirable, and a laser having an oscillation wavelength in an infrared or near-infrared range, such as a carbon dioxide laser, a YAG laser, a semiconductor laser or a fiber laser, is one of preferable lasers. An ultraviolet laser having an oscillation wavelength in an ultraviolet range, for example an excimer laser, a YAG laser having a wavelength converted to a third or fourth high harmonic wave, a copper vapor laser or the like is capable of abrasion processing to cut a bond of organic molecules, and is suitable microprocessing. A laser having an extremely high peak output, such as a femto-second laser, may also be used. The laser may be a continuous irradiation laser or a pulse irradiation laser. The resin generally has an absorption at near about 10 μm, i.e. the oscillation wavelength of the carbon dioxide gas laser, and therefore it is not particular necessary to add a component to help absorption of laser light. The YAG laser, the semiconductor laser and the fiber laser have an oscillation wavelength at near 1 μm, but there are not so many organic materials having an optical absorption in the wavelength range. In this case, addition of a dye or a pigment which is a component to help the absorption is required. Examples of such dyes include poly (substituted) phthalocyanine compounds and metal-containing phthalocyanine compounds; cyanine compounds; squarryum dyes; chalcogenopyrilo allylidene dyes; chloronium dyes; metal thiolated dyes; bis(chalcogenopyrilo)polymethine dyes; oxyindolizine dyes; bis(aminoaryl)polymethine dyes; melocyanine dyes; and quinoide dyes. Examples of pigments include dark-color inorganic pigments such as carbon black, graphite copper chromite, chrome oxide, cobalt chrome aluminate and iron oxide, metal powders of iron, aluminum, copper, zinc and the like, and these metals doped with Si, Mg, P, Co, Ni, Y and the like. These dyes and pigments may be used alone, or may be used in combination of two or more types, or may be combined in any form such as a multilayered structure. However, when the photosensitive resin composition is cured using an ultraviolet ray or a visible light ray, the added amount of coloring matter or pigment having an absorption in a light ray range used is preferably limited to a low level for curing the printing original plate to its inside.

Sculpture with a laser is carried out under an oxygen-containing gas, generally under the presence of air or a gas stream, but may be carried out under carbon dioxide gas or nitrogen gas. Powdered or liquid materials emerging in a slight amount on the surface of a relief printing plate after completion of sculpture may be removed using an appropriated method, for example a method in which the materials are washed out with a solvent, water containing a surfactant, or the like, a method in which an aqueous cleaner is jetted by a high-pressure spray or the like, or a method in which high-pressure steam is jetted.

In the present invention, post-exposure in which light having a wavelength of 200 nm to 450 nm is applied to the surface of a printing plate on which patterns are formed may be carried out subsequently to a step of removing powdered or viscous liquid debris remaining on the surface of the plate after sculpture for applying laser light to form recessed patterns. The post-exposure is a method that is effective in removal of tacks on the surface. The post-exposure may be in any of environments of air, an inert gas atmosphere and water. The post-exposure is especially effective when a hydrogen extraction photopolymerization initiator is contained in the photosensitive resin composition used. Further, before the post-exposure step, the surface of the printing plate may be treated with a treatment liquid containing a hydrogen extraction photopolymerization initiator. The printing plate may be exposed to light with the printing plate immersed in the treatment liquid containing a hydrogen extraction photopolymerization initiator.

The original plate produced according to the present invention can be applied and used for various kinds of applications such as stamps/seals, design rolls for embossing, relief images for the patterning of insulator, resistor and conductor pastes that are used for fabrication of electronic components, relief images for mold materials of ceramic products, relief images for displays such as advertisement/display boards, and molds/matrixes of various kinds of molded products.

The present invention will be described based on examples, but the present invention is not limited to these examples.

In examples and Comparative Examples, laser engraving was carried out using a carbon dioxide gas sculpture machine (trade mark "ZED-mini-1000" manufactured by ZED Co., Ltd. (United Kingdom), and for patterns of sculpture, patterns including dots, line drawings by salient lines having a width of 500 μm, and void lines having a width of 500 μm were created. Since the area of the top part of fine dot portion patterns cannot be ensured and the patterns get out of shape and become unclear if the sculpture depth is set to be large, the sculpture depth was set to 0.55 mm.

After laser engraving, debris on the relief printing plate was wiped off using a nonwoven fabric (trade mark "BEMCOT M-3" manufactured by Asahi Chemical Industry Co., Ltd.) impregnated with ethanol or acetone. The weights of the printing original plate before laser engraving, the printing plate just after laser engraving and the relief printing plate just after wiping off debris were measured, and the residual ratio of debris during sculpture was determined according to the following formula.

(weight of plate just after sculpture−weight of plate after wiping off debris)÷(weight of original plate before sculpture−weight of plate after wiping off debris)×100

Measurement of tacks on the surface of the relief printing plate after wiping off debris was carried out using Tack Tester manufactured by Toyo Seiki Seisaku-Sho, Ltd. For the measurement of tacks, a part of 13 mm width of an aluminum ring having a radius of 50 mm and a width of 13 mm is brought into contact with a flat part of a sample piece at 20° C., a load of 0.5 kg is imposed on the aluminum ring, the aluminum ring is left standing for 4 seconds, the above described aluminum ring is then lifted at a constant speed of 30 mm per minute, and a resistance force when the aluminum ring departs from the sample piece is read with a push pull gage. As this value increases, the tackiness degree increases and the adhesive strength becomes higher.

Further, the shape of a dot portion having an area ratio of about 10% at 80 lpi (lines per inch) among sculpted parts was observed with an electron microscope.

The dynamic viscoelasticity was measured under conditions of a frequency of 1 Hz (tensile mode, sine wave), a sample length of 30 mm (distance between chucks), a vibration displacement of 15 μm, a minimum load of about 100 to 300 mN, a measurement temperature range of from −150° C. to 60° C. (rise of temperature at constant speed, 4° C./minute), and a measurement atmosphere under a nitrogen gas stream using a non-resonant forced stretch vibration apparatus (trade mark "DMS 6100" manufactured by Seiko Instruments Inc.). The sample had a width of 10 mm and a thickness of 1 mm.

Tensile properties of the photosensitive resin composition were measured using an autograph (trade mark "AGS-100G" manufactured by Shimadzu Corporation). The sample was punched out into a dumbbell shape, so that the test piece had a width of 3 mm and a length of 30 mm. For the measurement of the breaking strength and the tensile elongation, the sample was stretched at a speed of 500 mm per minute using a 196 N road cell.

For the measurement of the specific surface area of fine particles and the pore distribution, measurements were made by adsorption of nitrogen gas under an atmosphere of the liquid nitrogen temperature using AUTOSOAP 3MP manufactured by Quantachrome Corporation (United States).

As the resin (a), resins (a1) to (a3) were produced in production Examples 1 to 3 described below.

Production Example 1

To a 1 L separable flask having a thermometer, a stirrer and a circulator were added 447.24 g of polycarbonate diol (trade mark "PCDL L4672" (number average molecular weight: 1990; and OH value: 56.4) manufactured by Asahi Chemical Industry Co., Ltd.) and 30.83 g of tolylene diisocyanate, the mixture was allowed to react for about 3 hours under heating at 80° C., 14.83 g of 2-methacryloyl oxyisocyanate was then added, and the mixture was further allowed to react for about 3 hours to produce a resin (a1) having a methacryl group (having about two intramolecular polymerizable unsaturated groups per molecule on the average) at the end and having a number average molecular weight of about 10000. This resin was in the form of thick malt syrup at 20° C., was fluidized when applying an external force, and did not recover its original shape even when removing the external force.

Production Example 2

To a 1 L separable flask having a thermometer, a stirrer and a circulator were added 447.24 g of polycarbonate diol (trade mark "PCDL L4672" (number average molecular weight: 1990; and OH value: 56.4) manufactured by Asahi Chemical Industry Co., Ltd.) and 30.83 g of tolylene diisocyanate, the mixture was allowed to react for about 3 hours under heating at 80° C., 7.42 g of 2-methacryloyl oxyisocyanate was then added, and the mixture was further allowed to react for about 3 hours to produce a resin (a2) having a methacryl group (having about one intramolecular polymerizable unsaturated group per molecule on the average) at the end and having a number average molecular weight of about 10000. This resin was in the form of thick malt syrup at 20° C., was fluidized when applying an external force, and did not recover its original shape even when removing the external force.

Production Example 3

To a 1 L separable flask having a thermometer, a stirrer and a circulator were added 449.33 g of polycarbonate diol (trade mark "PCDL L4672" (number average molecular weight: 1990; and OH value: 56.4) manufactured by Asahi Chemical Industry Co., Ltd.) and 12.53 g of tolylene diisocyanate, the mixture was allowed to react for about 3 hours under heating at 80° C., 47.77 g of 2-methacryloyl oxyisocyanate was then added, and the mixture was further allowed to react for about 3 hours to produce a resin (a3) having a methacryl group (having about two intramolecular polymerizable unsaturated groups per molecule on the average) at the end and having a number average molecular weight of about 3000. This resin was in the form of thick malt syrup at 20° C., was fluidized when applying an external force, and did not recover its original shape even when removing the external force.

Examples 1 to 7

(Fabrication of Cylindrical Flexographic Printing Original Plate)

To each of the resins (a1) to (a3) obtained in the above described production examples were added an organic compound having a polymerizable unsaturated group, porous fine powdered silica (trade mark "Sylosphere C-1504" (hereinafter abbreviated as C-1504; number average particle diameter: 4.5 µm, specific surface area: 520 $m^2/g$; average pore diameter: 12 nm; pore volume: 1.5 ml/g; ignition loss: 2.5 wt %; and oil absorption: 290 ml/100 g), trade mark "Sylysia 450" (hereinafter abbreviated as CH-450; number average particle diameter: 8.0 µm, specific surface area: 300 $m^2/g$; average pore diameter: 17 nm; pore volume: 1.25 ml/g; ignition loss: 5.0 wt %; and oil absorption: 200 ml/100 g), and trade mark "Sylysia 470" (hereinafter abbreviated as C-470; number average particle diameter: 14.1 µm, specific surface area: 300 $m^2/g$; average pore diameter: 17 nm; pore volume: 1.25 ml/g; ignition loss: 5.0 wt %; and oil absorption: 180 ml/100 g) manufactured by Fuji Silysia Chemical Ltd. as an inorganic porous material, and other additives as shown in Table 1 to prepare a liquid photosensitive resin composition. A cushion tape having adhesive layers on opposite surfaces was stuck on a cylindrical support having a thickness of 2 mm, an inner diameter of 213.384 mm and a width of 300 mm and made of a glass fiber reinforcement plastic such that air bubbles were kept out. Further, a PET film having a thickness of 100 µm and provided on one surface with an adhesive was wrapped on the cushion tape to be fixed such that the surface with an adhesive was on the front side. The photosensitive resin composition obtained in the manner described above was coated on the PET film in a thickness of 1.9 mm using a doctor blade while rotating the cylindrical support, and a seamless photosensitive resin composition layer was thereby formed to obtain a cylindrical laminate. Further, the surface of the obtained cylindrical laminate was irradiated with an ultraviolet ray from a metal halide lamp (trade mark "M056-L21" manufactured by Eyegraphics Co., Ltd.) in an amount of 4000 $mJ/cm^2$ (amount integrated using a UV meter and UV-35-APR Filter) in air to fabricate a cylindrical printing original plate. Thereafter, for adjusting the thickness of the printing original plate, cutting was performed using a cemented carbide bite and polishing was performed using a polishing cloth, whereby a cured photosensitive resin layer having a thickness of 1.7 mm was formed. A carbon dioxide gas laser engraving machine was used to form concavo-convex patterns on the surface of the cylindrical printing original plate thus obtained.

The lamp illuminance at the surface of the photosensitive resin composition layer was measured using a UV meter (trade mark "UV-M02" manufactured by ORC Manufacturing Co., Ltd.). The lamp illuminance measured using a filter (trade mark "UV-35-APR Filter" manufactured by ORC Manufacturing Co., Ltd.) was 100 $mW/cm^2$, and the lamp illuminance measured using a filter (trade mark "UV-25 Filter" manufactured by ORC Manufacturing Co., Ltd.) was 14 $mW/cm^2$.

In Examples 1 to 7, debris generated when cutting the plate using a cemented carbide bite was easily removed, and cutting processing was completed with no debris clinging to the bite. Deep cut marks were not particularly observed on the surface after cutting processing. In a subsequent polishing step by the polishing cloth, processing was completed with no particular trouble. In any case, the obtained surface was smooth, and scars and the like were not observed on the surface.

The degree of porosity of the porous fine powdered silica used was 780 for Sylosphere C-1504, 800 for Sylysia 450 and 1410 for Sylysia 470 when calculated with the density set to 2 $g/cm^3$.

The results of evaluations of printing plates subjected to laser engraving are shown in Table 2. The number of times of wipe of debris after sculpture in Table 2 refers to the number of times of wipe processing required for removing sticky liquid debris generated after sculpture, and if this number of times is large, it means that the amount of liquid debris is large.

A sample for measurement of dynamic viscoelasticity using a non-resonant forced stretch vibration apparatus was prepared separately. The photosensitive resin composition used in Example 1 was coated in a thickness of 1 mm on a PET film, and photo-cured by applying light from a metal halide lamp in air to prepare a sample. The sample was cut to a width of 10 mm to prepare a sample for measurement of dynamic viscoelasticity. For the measurement of viscoelasticity, the PET film was peeled off. Reference symbol A in FIG. 1 and reference symbol A in FIG. 2 denote graphs showing the dependency on temperature of a storage elastic modulus (E') and the dependency on temperature of a loss tangent (tan δ), respectively, for a sample obtained by photo-curing the photosensitive resin composition of example 1 by the metal halide lamp. The storage elastic modulus was 5.5 MPa at room temperature, which was lower than the value of a system photo-cured by applying low-illuminance light (Comparative Example 2). The loss tangent had a peak at around −15° C., and the value at the peak temperature was 0.97, which was higher than the value of the system photo-cured by applying low-illuminance light (Comparative Example 2).

The Shore A hardness of the photo-cured materials of Examples 1 to 7 showed values lower by 4 to 5 degrees than that of a sample photo-cured by applying light from a chemical lamp and a bactericidal lamp in air. The illuminances of the chemical lamp and the bactericidal lamp were measured using a UV meter (trade mark "UV-M02" manufactured by ORC Manufacturing Co., Ltd.). The lamp illuminance measured using a filter (trade mark "UV-35-APR Filter" manufactured by ORC Manufacturing Co., Ltd.) was 3.1 $mW/cm^2$, and the lamp illuminance measured using a filter (trade mark "UV-25 Filter" manufactured by ORC Manufacturing Co., Ltd.) was 1 $mW/cm^2$. The amount of energy of applied light was 4000 $mJ/cm^2$ as a value integrated using UV-35 Filter, and 500 $mJ/cm^2$ as a value integrated using UV-25 Filter.

A cylindrical cured photosensitive resin was formed in the same manner as in Example 1 except that a PET film provided on the surface with no adhesive layer was used as a support. The PET film was peeled from the cylindrical support, and the PET film was further peeled off to form a sample for the tensile test. As a result of conducting the tensile test, the breaking strength was 14 MPa and the tensile elongation was 374%. These values were higher by 63% for the breaking strength and by 23% for the tensile elongation than those of a sample formed by the same method as in Example 1 in which the same photosensitive resin composition was used and light of the same amount of energy was applied except that the above described chemical lamp and bactericidal lamp were used (Comparative Example 1).

In Examples 1 to 7, the temperatures of the surface of the photosensitive resin composition during application of light and the surface of the cured photosensitive resin were less than 60° C. as a result of making measurements using a thermometer.

Example 8

A PET film with an adhesive having a thickness of 125 μm was used as a sheeted support, and the photosensitive resin composition used in Example 1 was coated on the surface of the PET film coated with an adhesive using a doctor blade. Light of 4000 mJ/cm$^2$ (value measured using a UV meter and UV-35-APR Filter) as an integrated light amount was applied to the obtained photosensitive resin composition layer in air while moving the metal halide lamp same as that of Example 1 to obtain a cured photosensitive resin layer having a thickness of 1.7 mm.

Patterns were formed on the obtained printing original plate using a carbon dioxide gas laser engraving machine. They were conical favorable patterns in a pattern portion of fine dots.

A part of the obtained printing plate was cut out to prepare a sample for measurement of the hardness. Using a Zwick automatic hardness meter, a value 15 seconds after the start of the measurement was determined as the Shore A hardness. As a result, the Shore A hardness was 72 degrees.

The lamp illuminance at the surface of the photosensitive resin composition layer was measured using a UV meter (trade mark "UV-M02" manufactured by ORC Manufacturing Co., Ltd.). The lamp illuminance measured using a filter (trade mark "UV-35-APR Filter" manufactured by ORC Manufacturing Co., Ltd.) was 100 mW/cm$^2$, and the lamp illuminance measured using a filter (trade mark "UV-25 Filter" manufactured by ORC Manufacturing Co., Ltd.) was 14 mW/cm$^2$.

Example 9

One hundred parts of SBS thermoplastic elastomer (SBS: polystyrene/polybutadiene/polystyrene block copolymer) having a number average molecular weight of about 130,000 as the resin (a), 5 parts of 1,9-nonanediol diacrylate as the organic compound (b), 30 parts of liquid polybutadiene having a number average molecular weight of about 2000 as a plasticizer, 1 part of 2,2-dimethoxy-2-phenylacetophenone as a photopolymerization initiator, and 0.3 parts of 2,6-di-t-butyl-4-methylphenol as a polymerization inhibitor were kneaded at 130° C. using a kneader to obtain a photosensitive resin composition that was solid at 20° C.

The obtained photosensitive resin composition was heated and extruded in a thickness of 1 mm on a PET film having a thickness of 125 μm using an extruder, cooled and then photo-cured by applying light from a metal halide lamp in air to prepare a sample. The sample was cut to a width of 10 mm to prepare a sample for measurement of dynamic viscoelasticity. For the measurement of viscoelasticity, the PET film was peeled off. Reference symbol A in FIG. 3 and reference symbol A in FIG. 4 denote graphs showing the dependency on temperature of the storage elastic modulus (E') and the dependency on temperature of the loss tangent (tan δ), respectively, for a sample obtained by photo-curing the photosensitive resin composition of Example 9 by the metal halide lamp. The storage elastic modulus was 3.6 MPa at 20° C., which was lower than the value of a system photo-cured by applying low-illuminance light (Comparative Example 3). The loss tangent had a peak at around −76° C., and the value at the peak temperature was 0.78, which was higher than the value of the system photo-cured by applying low-illuminance light (Comparative Example 3).

The metal halide lamp used for photo-curing was same as the lamp used in Examples 1 to 7. The illuminance of the lamp at the surface of the photosensitive resin was the same.

Further, the above described photosensitive resin composition was extruded in a thickness of 2 mm at 130° C. with a PET film as a support using an extruder to form a sheeted photosensitive resin composition. A double-faced tape was stuck on a cylindrical support having a thickness of 2 mm, an inner diameter of 213.384 mm and a width of 300 mm and made of a glass fiber reinforcement plastic, which was mounted in an air cylinder, and the sheeted photosensitive resin composition with a PET film as a support was stuck on the tape to be fixed. The above described photosensitive resin composition was filled in air gaps at joints while being heated to form a cylindrical photosensitive resin composition. Thereafter, light from the above described metal halide lamp was applied in air to form a cured cylindrical photosensitive resin. Cutting processing was performed using a cemented carbide bite and the surface was polished using a polishing cloth as in Example 1. Cutting processing, during which debris generated in cutting processing did not cling to the bite, was completed, and a smooth surface could be obtained after polishing processing. Scars and the like were not observed on the surface of the cylindrical printing substrate obtained.

Example 10

The photosensitive resin composition same as that of Example 1 was coated in a thickness of 1.7 mm on a PET film, and light from a high pressure mercury lamp was applied to thereto in air to obtain a cured photosensitive resin. The Shore A hardness of the obtained cured photosensitive resin was measured using a Zwick automatic hardness meter, and a value 15 seconds after the start of the measurement was adopted. The Shore A hardness was 72.5 degrees.

The illuminance of the high pressure mercury lamp used for irradiation, at the surface of the photosensitive resin, was measured using a UV meter (trade mark "UV-M02" manufactured by ORC Manufacturing Co., Ltd.). The lamp illuminance measured using a filter (trade mark "UV-35-APR Filter" manufactured by ORC Manufacturing Co., Ltd.) was 31.3 mW/cm$^2$, and the lamp illuminance measured using a filter (trade mark "UV-25 Filter" manufactured by ORC Manufacturing Co., Ltd.) was 3.95 mW/cm$^2$. The amount of energy of applied light was 4000 mJ/cm$^2$ as a value integrated using UV-35 Filter, and 505 mJ/cm$^2$ as a value integrated using UV-25 Filter.

The temperatures of the surface of the photosensitive resin composition during application of light and the surface of the cured photosensitive resin were less than 60° C. as a result of making measurements using a thermometer.

Example 11

A PET film with an adhesive having a thickness of 125 μm was used as a sheeted support, and the photosensitive resin composition used in Example 1 was coated on the surface of the PET film coated with an adhesive using a doctor blade. Light of 4000 mJ/cm$^2$ (value measured using a UV meter and UV-35-APR Filter) as an integrated light amount was applied from an electrodeless metal halide lamp (trade mark "F450T I250B D Bulb" manufactured by Fusion Corporation (United States)) to the obtained photosensitive resin composition layer in air to obtain a cured photosensitive resin layer having a thickness of 1.7 mm.

Patterns were formed on the obtained printing original plate using a carbon dioxide gas laser engraving machine. They were conical favorable patterns in a pattern portion of fine dots.

A part of the obtained printing plate was cut out to prepare a sample for measurement of the hardness. Using a Zwick automatic hardness meter, a value 15 seconds after the start of the measurement was determined as the Shore A hardness. As a result, the Shore A hardness was 71 degrees.

The lamp illuminance at the surface of the photosensitive resin composition layer was measured using a UV meter (trade mark "UV-M02" manufactured by ORC Manufacturing Co., Ltd.). The lamp illuminance measured using a filter (trade mark "UV-35-APR Filter" manufactured by ORC Manufacturing Co., Ltd.) was 363 mW/cm$^2$, and the lamp illuminance measured using a filter (trade mark "UV-25 Filter" manufactured by ORC Manufacturing Co., Ltd.) was 50 mW/cm$^2$.

The temperatures of the surface of the photosensitive resin composition during application of light and the surface of the cured photosensitive resin were less than 80° C. as a result of making measurements using a thermometer.

Comparative Example 1

A photosensitive resin composition layer was formed in the same manner as in Example 8. The photosensitive resin composition was photo-cured to form a printing original plate under conditions different from those of Example 8 only in that a PET cover film with a release agent having a thickness of 15 μm was stuck on the obtained photosensitive resin composition layer and the lamp was a chemical lamp (trade mark "370 Fluorescent Lamp for APR (trade mark "FLR 20S-B-DU-37C/M" manufactured by Toshiba Corporation, 20 watt)" manufactured by Toshiba Corporation; central wavelength: 370 nm).

The PET cover film was peeled off, and patterns were formed using a carbon dioxide gas laser engraving machine. They were conical favorable patterns in a pattern portion of fine dots.

A part of the obtained printing plate was cut out to prepare a sample for measurement of the hardness. Using a Zwick automatic hardness meter, a value 15 seconds after the start of the measurement was determined as the Shore A hardness. As a result, the Shore A hardness was 76 degrees. The value was higher by 4 degrees than that of Example 8.

The lamp illuminance at the surface of the photosensitive resin composition layer was measured using a UV meter (trade mark "UV-M02" manufactured by ORC Manufacturing Co., Ltd.). The lamp illuminance measured using a filter (trade mark "UV-35-APR Filter" manufactured by ORC Manufacturing Co., Ltd.) was 3.1 mW/cm$^2$, and the lamp illuminance measured using a filter (trade mark "UV-25 Filter" manufactured by ORC Manufacturing Co., Ltd.) was 0 mW/cm$^2$.

A part of the obtained printing plate on which no patterns were formed was cut out, the cured photosensitive resin was separated from the PET, cooled by liquid nitrogen, and then crushed using a hammer to obtain a powder (G). A powder (H) was obtained in the same manner from the printing plate of Example 8. The powders (G) and (H) were weighed to the same weight, and were each set in a pyrolysis gas chromatograph apparatus (with a mass spectrometer). This apparatus consists of a pyrolysis apparatus (trade mark "Py-2010D" manufactured by Frontier Laboratories Ltd), a capillary gas chromatograph apparatus (abbreviated as GC) and a mass spectrometer (abbreviated as MS; trade mark "Automass Sun" manufactured by JEOL LTD.). Each sample was heated at 250° C. for 30 minutes in a heating furnace, and a generated gas was collected using a cryo-focusing method of trapping the gas with liquid nitrogen. The collected gas was analyzed using GC/MS and the amount thereof was compared. As a result, the collected gas was found to be the organic compound (b) in the photosensitive resin composition. The analysis by the thermogravimetric analysis method (TG method; apparatus used for analysis: manufactured by Shimadzu Corporation; trade mark "TGA-50") showed that the collected gas was not heat-decomposed at 250° C., and therefore the gas is presumed to be an unreacted organic compound (b). The amount of compound presumed to be an unreacted organic compound (b) in Example 8 was about one third of that in Comparative Example 1.

Comparative Example 2

A sheeted sample for measurement of dynamic viscoelasticity using a non-resonant forced stretch vibration apparatus was prepared. The photosensitive resin composition used in Example 1 was coated in a thickness of 1 mm on a PET film treated for release, and was photo-cured by applying light from a chemical lamp and a bacteriocidal lamp in air to prepare a sample.

Figure 2:
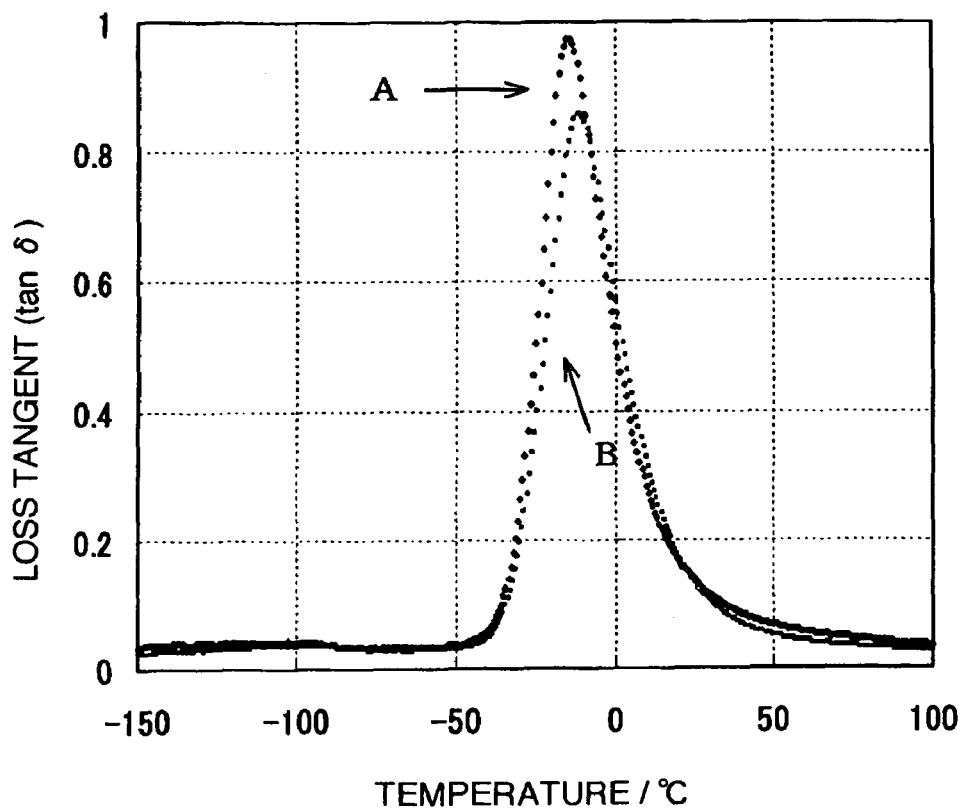
FIG. 2 is a graph showing the dependency on temperature of a loss tangent in Example 1 and Comparative Example 2.

The dependency on temperature of the storage elastic modulus and the dependency on temperature of the loss tangent (tan δ) in the measurement of dynamic viscoelasticity are shown in graphs B of FIG. 1 and B of FIG. 2, respectively. The storage elastic modulus was 6.9 MPa at room temperature, which was higher than the value of the system photo-cured by applying high-illuminance light (Example 1). In the dependency on temperature of the loss tangent, a peak was shown at −11° C., and the value of the loss tangent at the peak temperature was 0.86, which was lower than the value of the system photo-cured by applying high-illuminance light (Example 1).

The illuminance of the lamp used was measured using a UV meter (trade mark "UV-M02" manufactured by ORC Manufacturing Co., Ltd.). The lamp illuminance measured using a filter (trade mark "UV-35-APR Filter" manufactured by ORC Manufacturing Co., Ltd.) was 3.1 mW/cm$^2$, and the lamp illuminance measured using a filter (trade mark "UV-25 Filter" manufactured by ORC Manufacturing Co., Ltd.) was 1 mW/cm$^2$. The amount of energy of applied light was 4000 mJ/cm$^2$ as a value integrated using UV-35 Filter, and 500 mJ/cm$^2$ as a value integrated using UV-25 Filter.

Comparative Example 3

A sheeted sample for measurement of dynamic viscoelasticity using a non-resonant forced stretch vibration apparatus was prepared. The photosensitive resin composition used in Example 9 was heated and extruded in a thickness of 1 mm on a PET film using an extruder, cooled and then photo-cured by applying light from a chemical lamp and a bacteriocidal lamp in air to prepare a sample.

Figure 3:
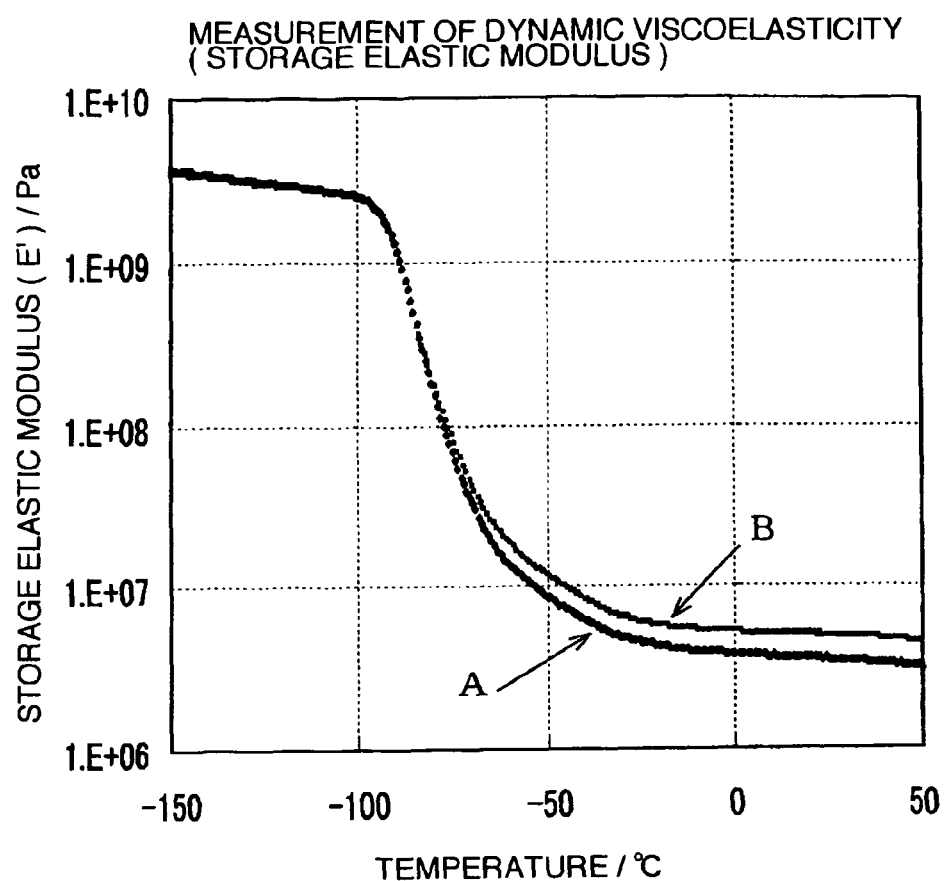
FIG. 3 is a graph showing the dependency on temperature of the storage elastic module in Example 9 and Comparative Example 3.
Figure 4:
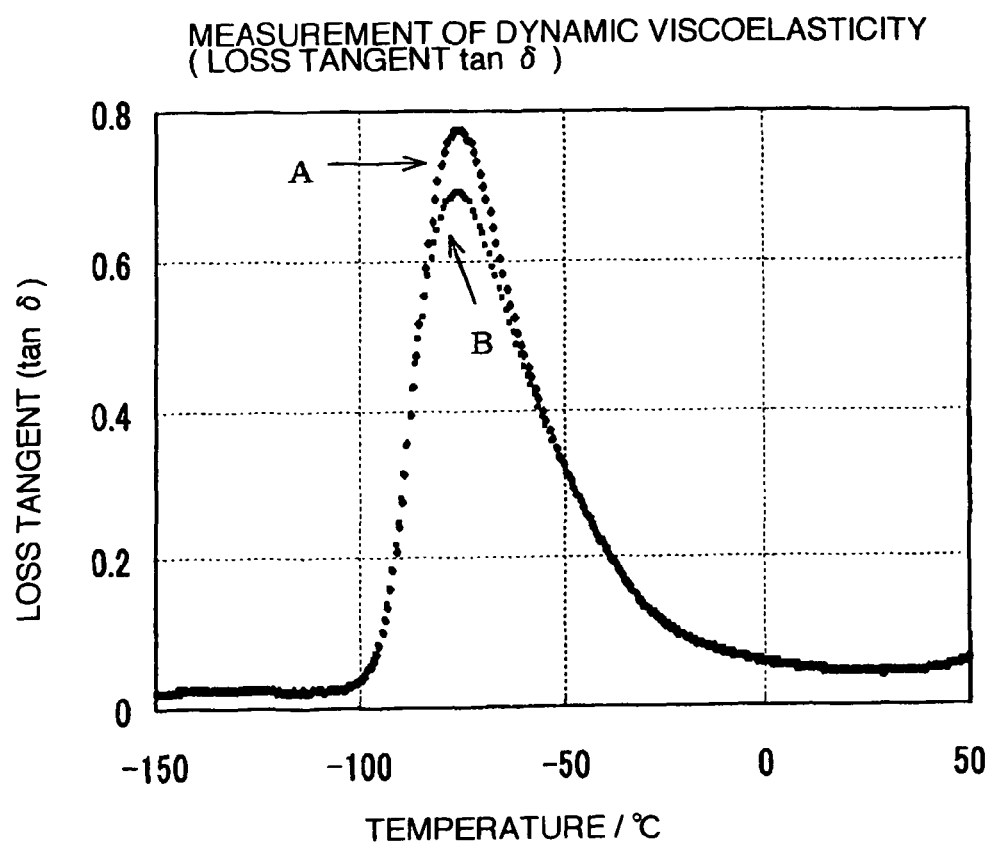
FIG. 4 is a graph showing the dependency on temperature of the loss tangent in Example 9 and Comparative Example 3.

The dependency on temperature of the storage elastic modulus and the dependency on temperature of the loss tangent (tan δ) in the measurement of dynamic viscoelasticity are shown in graphs B of FIG. 3 and B of FIG. 4, respectively. The storage elastic modulus was 5.0 MPa at 20° C., which was higher than the value of the system photo-cured by applying high-illuminance light (Example 9). In the dependency on temperature of the loss tangent, a peak was shown at −75° C., and the value of the loss tangent at the peak temperature was 0.69, which was lower than the value of the system photo-cured by applying high-illuminance light (Example 9)

Comparative Example 4

The photosensitive resin composition same as that of Example 1 was coated in a thickness of 1.7 mm on a PET film, and the photosensitive resin composition was covered with a PET cover film having a thickness of 15 μm. Thereafter, light from a high pressure mercury lamp was applied from the PER cover film side to obtain a cured photosensitive resin. The Shore A hardness of the obtained cured photosensitive resin was measured using a Zwick automatic hardness meter, and a value 15 seconds after the start of the measurement was adopted. The Shore A hardness was 74 degrees.

The illuminance of the high pressure mercury lamp used for irradiation at the surface of the photosensitive resin was measured using a UV meter (trade mark "UV-M02" manufactured by ORC Manufacturing Co., Ltd.). The lamp illuminance measured using a filter (trade mark "UV-35-APR Filter" manufactured by ORC Manufacturing Co., Ltd.) was 31.3 mW/cm$^2$, and the lamp illuminance measured using a filter (trade mark "UV-25 Filter" manufactured by ORC Manufacturing Co., Ltd.) was 0 mW/cm$^2$. The amount of energy of applied light was 4000 mJ/cm$^2$ as a value integrated using UV-35 Filter, and 0 mJ/cm$^2$ as a value integrated using UV-25 Filter.

Comparative Example 5

A cylindrical cured photosensitive resin was formed in the same manner as in Example 1 except that as the light source used for photo-curing, the metal halide lamp was changed to the chemical lamp and the bacteriocidal lamp used in Comparative Example 2. Debris generated in cutting processing by a cemented carbide bite clung to the bite two or more times, and therefore on each occasion, processing was stopped to remove debris. After the cutting processing step, deep cut marks were observed on some parts of the surface. The cut marks could not be removed by polishing processing using a polishing cloth.

Comparative Example 6

A liquid photosensitive resin composition was prepared in the same manner as in Example 1 except that the organic compound (b) used in Example 1 was replaced by diethylene glycol monobutyl ether monomethacrylate in a total amount.

A sheeted cured photosensitive resin was formed by applying low-illuminance light in the same manner as in Comparative Example 1 except that the prepared liquid photosensitive resin composition was used. The Shore A hardness of the obtained cured photosensitive resin was 72 degrees as a result of making a measurement in the same manner as in Example 8 (the photosensitive resin composition was designed to have a hardness same as that in Example 8). In mechanical properties, the breaking strength decreased by 65% and the tensile elongation decreased by 35% as compared to Example 8. In a solvent resistance test of immersion in isopropyl alcohol containing 20 vol % of ethyl acetate, the rate of change in weight after immersion for 24 hours was 22.3 wt %, showing a considerable degradation in solvent resistance (the rate was 8 wt % in Example 8). Thus, in the system in which the photosensitive resin composition was set to have a hardness same as that in Example 8, a considerable degradation in solvent resistance and mechanical properties was confirmed.

Comparative Example 7

A liquid photosensitive resin composition was prepared in the same manner as in Example 1 except that the organic compound (b) used in Example 1 was replaced by phenoxy-polyethylene glycol acrylate (trade mark "Light Acrylate P-200A" manufactured by Kyoeisha Chemical Co., Ltd.) in a total amount.

A sheeted cured photosensitive resin was formed by applying low-illuminance light in the same manner as in Comparative Example 1 except that the prepared liquid photosensitive resin composition was used. The Shore A hardness of the obtained cured photosensitive resin was 72.5 degrees as a result of making a measurement in the same manner as in Example 8 (the photosensitive resin composition was designed to have a hardness almost same as that in Example 8). In mechanical properties, the breaking strength decreased by 50% and the tensile elongation decreased by 40% as compared to Example 8. In a solvent resistance test of immersion in isopropyl alcohol containing 20 vol % of ethyl acetate, the rate of change in weight after immersion for 24 hours was 9 wt %, showing that the solvent resistance was comparable to that in Example 8 (the rate was 8 wt % in Example 8). Thus, in the system in which the photosensitive resin composition was set to have a hardness same as that in Example 8, a considerable degradation in mechanical properties was confirmed.

Comparative Example 8

A liquid photosensitive resin composition was prepared in the same manner as in Example 1 except that the organic compound (b) used in Example 1 was replaced by 30 parts by weight of phenoxyethyl acrylate (trade mark "Light Acrylate PO-A" manufactured by Kyoeisha Chemical Co., Ltd.), 10 parts by weight of diethylene glycol monobutyl ether monomethacrylate and 8 parts by weight of phenoxy-polyethylene glycol acrylate (trade mark "Light Acrylate P-200A" manufactured by Kyoeisha Chemical Co., Ltd.).

A sheeted cured photosensitive resin was formed by applying low-illuminance light in the same manner as in Comparative Example 1 except that the prepared liquid photosensitive resin composition was used. The Shore A hardness of the obtained cured photosensitive resin was 72.5 degrees as a result of making a measurement in the same manner as in Example 8 (the photosensitive resin composition was designed to have a hardness almost same as that in Example 8). In mechanical properties, the breaking strength decreased by 50% and the tensile elongation decreased by 32% as compared to Example 8. In a solvent resistance test of immersion in isopropyl alcohol containing 20 vol % of ethyl acetate, the rate of change in weight after immersion for 24 hours was 9 wt %, showing that the solvent resistance was comparable to that in Example 8 (the rate was 8 wt % in Example 8). Thus, in the system in which the photosensitive resin composition was set to have a hardness same as that in Example 8, a considerable degradation in mechanical properties was confirmed.

Comparative Example 9

A liquid photosensitive resin composition was prepared in the same manner as in Example 1 except that the organic compound (b) used in Example 1 was replaced by 36 parts by weight of phenoxyethyl acrylate (trade mark "Light Acrylate PO" manufactured by Kyoeisha Chemical Co., Ltd.) and 12 parts by weight of diethylene glycol monobutyl ether monomethacrylate.

A sheeted cured photosensitive resin was formed by applying low-illuminance light in the same manner as in Comparative Example 1 except that the prepared liquid photosensitive resin composition was used. The Shore A hardness of the obtained cured photosensitive resin was 72.5 degrees as a result of making a measurement in the same manner as in Example 8 (the photosensitive resin composition was designed to have a hardness almost same as that in Example 8). In mechanical properties, the breaking strength decreased by 38% and the tensile elongation decreased by 20% as compared to Example 8. In a solvent resistance test of immersion in isopropyl alcohol containing 20 vol % of ethyl acetate, the rate of change in weight after immersion for 24 hours was 8 wt %, showing that the solvent resistance was comparable to that in Example 8 (the rate was 8 wt % in Example 8). Thus, in the system in which the photosensitive resin composition was set to have a hardness same as that in Example 8, a considerable degradation in mechanical properties was confirmed.

TABLE 2

| | Number of times of wipe of debris after engraving (BEMCOT with ethanol) | Shape of dot portion |
|---|---|---|
| Example 1 | ≦3 | Conical and favorable |
| Example 2 | ≦3 | Conical and favorable |
| Example 3 | ≦3 | Conical and favorable |
| Example 4 | ≦3 | Conical and favorable |
| Example 5 | ≦3 | Conical and favorable |
| Example 6 | ≦3 | Conical and favorable |
| Example 7 | ≦3 | Conical and favorable |

INDUSTRIAL APPLICABILITY

The present invention is suitable as a method for producing a cylindrical or sheeted printing substrate capable of laser engraving, which is suitable for formation of a relief image for a flexographic printing plate by laser engraving, formation of a pattern for surface processing such as embossing, formation of a relief image for printing of a tile or the like, printing of a pattern of a conductor, a semiconductor or an insulator in

TABLE 1

| | Resin (a) | | Organic compound (b) | | Inorganic porous material (c) | | Polymerization initiator | | Other additives | |
|---|---|---|---|---|---|---|---|---|---|---|
| | Type | Blended amount | Type | Blended amount | Type | Blended amount | Type | Blended amount | Type | Blended amount |
| Example 1 | (a1) | 100 | PEMA | 37 | C-1504 | 7.7 | DMPAP | 0.9 | BHT | 0.5 |
| | | | BDEGMA | 12 | | | BP | 1.5 | | |
| Example 2 | (a2) | 100 | PEMA | 37 | C-1504 | 7.7 | DMPAP | 0.9 | BHT | 0.5 |
| | | | BDEGMA | 12 | | | BP | 1.5 | | |
| Example 3 | (a3) | 100 | PEMA | 37 | C-1504 | 7.7 | DMPAP | 0.9 | BHT | 0.5 |
| | | | BDEGMA | 12 | | | BP | 1.5 | | |
| Example 4 | (a1) | 100 | LMA | 6 | C-1504 | 7.7 | DMPAP | 0.9 | BHT | 0.5 |
| | | | PPMA | 15 | | | BP | 1.5 | | |
| | | | DEEHEA | 25 | | | | | | |
| | | | TEGDMA | 2 | | | | | | |
| | | | TMPTMA | 2 | | | | | | |
| Example 5 | (a1) | 100 | BZMA | 25 | C1504 | 7.7 | DMPAP | 0.9 | BHT | 0.5 |
| | | | CHMA | 19 | | | BP | 1.5 | | |
| | | | BDEGMA | 6 | | | | | | |
| Example 6 | (a1) | 100 | BZMA | 25 | CH-450 | 7.7 | DMPAP | 1.6 | BHT | 0.5 |
| | | | CHMA | 19 | | | | | | |
| | | | BDEGMA | 6 | | | | | | |
| Example 7 | (a1) | 100 | BZMA | 25 | C-470 | 7.7 | DMPAP | 0.9 | BHT | 0.5 |
| | | | CHMA | 19 | | | BP | 1.5 | | |
| | | | BDEGMA | 6 | | | | | | |

Unit of blended amount in table: parts by weight
(Description of abbreviations)
LMA: lauryl methacrylate (Mn254)
PPMA: polypropylene glycol monomethacrylate (Mn400)
DEEHEA: diethylene glycol-2-ethylhexyl methacrylate (Mn286)
TEGDMA: tetraethylene glycol dimethacrylate (Mn330)
TMPTMA: trimethylolpropane trimethacrylate (Mn339)
BZMA: benzyl methacrylate (Mn176)
CHMA: cyclohexyl methacrylate (Mn167)
BDEGMA: butoxydiethylene glycol methacrylate (Mn230)
PEMA: phenoxyethyl methacrylate (Mn206)
DMPAP: 2,2-dimethoxy-2-phenyl acetophenone
BP: benzophenone
BHT: 2,6-di-t-butyl acetophenone formation of an electronic circuit, formation of a pattern of a functional material such as antireflection film of an optical component, a color filter or a (near) infrared cut filters, and further, coating and formation of a pattern of an oriented film, a ground layer, a luminescent layer, an electron transport layer or a sealing material layer in production of a display element of a liquid crystal display, an organic electroluminescence display or the like.

The invention claimed is:

1. A process for producing a laser engravable printing substrate, comprising the steps of: forming a photosensitive resin composition layer on a cylindrical support or a sheeted support; and applying light to the formed photosensitive resin composition layer to form a cured photosensitive resin layer, and then adjusting a thickness of the cured photosensitive resin layer and shaping a surface of the cured photosensitive resin layer, wherein the light applied to the photosensitive resin composition layer includes light having a wavelength of 200 nm or more and 450 nm or less, and an illuminance of light at a surface of the photosensitive resin composition layer is 20 mW/cm$^2$ or more when measured using a UV meter configured with a filter which transmits light with a relative spectral sensitivity peak at 350 nm, and 3 mW/cm$^2$ or more when measured using the UV meter configured with filter which transmits light with a relative spectral sensitivity peak at 250 nm.

2. The process according to claim 1, wherein the illuminance of light at a surface of the photosensitive resin composition layer is 20 mW/cm$^2$ or more and 2 W/cm$^2$ or less when measured using a UV meter configured with a filter which transmits light with a relative spectral sensitivity peak at 350 nm, and 3 mW/cm$^2$ or more and 2 W/cm$^2$ or less when measured using the UV meter configured with a filter which transmits light with a relative spectral sensitivity peak at 250 nm.

3. The process according to claim 2, wherein said cured photosensitive resin layer has a thickness of 50 μm or more and 50 mm or less.

4. The process according to any one of claims 1 to 3, further comprising a step of applying light to the cured photosensitive resin layer again after the step of adjusting the thickness of the cured photosensitive resin layer and shaping the surface of the cured photosensitive resin layer, wherein the light applied to the cured photosensitive resin layer again includes light having a wavelength of 200 nm or more and 450 nm or less, and the illuminance of light at the surface of the cured photosensitive resin layer is 20 mW/cm$^2$ or more and 2 W/cm$^2$ or less when measured using a UV meter configured with a filter which transmits light with a relative spectral sensitivity peak at 350 nm, and 3 mW/cm$^2$ or more and 2 W/cm$^2$ or less when measured using the UV meter configured with a filter which transmits light with a relative spectral sensitivity peak at 250 nm.

5. The process according to any one of claims 1 to 3, wherein the light is applied to the photosensitive resin composition layer or the cured photosensitive resin layer in the air.

6. The process according to any one of claims 1 to 3, wherein the photosensitive resin composition layer is liquid at 20° C.

7. The process according to any one of claims 1 to 3, wherein the photosensitive resin composition layer is solid at 20° C.

8. The process according to any one of claims 1 to 3, wherein the cured photosensitive resin layer is a seamless layer.

9. The process according to any one of claims 1 to 3, wherein a lens or a concave mirror for collecting light exists between a light source for applying light and the photosensitive resin composition layer.

10. The process according to any one of claims 1 to 3, wherein the printing substrate is a flexographic printing original plate on which a concavo-convex pattern can be formed by applying laser light, a letter press printing original plate, a gravure printing original plate, a screen printing original plate on which a perforated pattern can be formed by applying laser light, or a blanket for offset printing.

11. The process according to claim 1, wherein the illuminance of light at a surface of the photosensitive resin composition layer is 50 mW/cm$^2$ or more and 1 W/cm$^2$ or less when measured using a UV meter configured with a filter which transmits light with a relative spectral sensitivity peak at 350 nm.

12. The process according to claim 3, wherein the temperature of the photosensitive resin composition layer or the cured photosensitive resin layer is −50° C. or more and 150° C. or less.

13. The process according to claim 4, wherein the light is applied to the photosensitive resin composition layer or the cured photosensitive resin layer in the air.

* * * * *

UNITED STATES PATENT AND TRADEMARK OFFICE
CERTIFICATE OF CORRECTION

| | |
|---|---|
| PATENT NO. | : 7,754,415 B2 |
| APPLICATION NO. | : 10/587403 |
| DATED | : July 13, 2010 |
| INVENTOR(S) | : Hiroshi Yamada et al. |

It is certified that error appears in the above-identified patent and that said Letters Patent is hereby corrected as shown below:

In claim 5, column 36, line 11, after "position layer", delete "or the cured photosensitive resin layer".

In claim 12, column 36, line 38, "claim 3," should read --claim 4,--.

Signed and Sealed this
Twenty-second Day of March, 2011

David J. Kappos
*Director of the United States Patent and Trademark Office*